(12) United States Patent
Lee et al.

(10) Patent No.: US 12,635,076 B2
(45) Date of Patent: May 19, 2026

(54) PRINTED CIRCUIT BOARD

(71) Applicant: SAMSUNG ELECTRO-MECHANICS CO., LTD., Suwon-si (KR)

(72) Inventors: Seung Eun Lee, Suwon-si (KR); Ki Hwan Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 200 days.

(21) Appl. No.: 18/608,111

(22) Filed: Mar. 18, 2024

(65) Prior Publication Data

US 2025/0071898 A1 Feb. 27, 2025

(30) Foreign Application Priority Data

Aug. 24, 2023 (KR) ........................ 10-2023-0111014

(51) Int. Cl.
*H05K 1/00* (2006.01)
*H05K 1/02* (2006.01)
*H05K 1/11* (2006.01)

(52) U.S. Cl.
CPC ........... *H05K 1/115* (2013.01); *H05K 1/0298* (2013.01); *H05K 2201/096* (2013.01); *H05K 2201/09827* (2013.01)

(58) Field of Classification Search
CPC ................. H05K 1/115; H05K 1/0298; H05K 2201/096; H05K 2201/09827
See application file for complete search history.

(56) References Cited

U.S. PATENT DOCUMENTS 9,549,468 B1* 1/2017 Tsai ................... H01L 23/49827
2022/0377902 A1* 11/2022 Shin ....................... H05K 1/111

FOREIGN PATENT DOCUMENTS

JP 2004-335726 A 11/2004
KR 10-2023-0009334 A 1/2023

* cited by examiner

*Primary Examiner* — Pete T Lee
(74) *Attorney, Agent, or Firm* — Morgan, Lewis & Bockius LLP

(57) ABSTRACT

The present disclosure relates to a printed circuit board including: a first insulating layer; a first wiring layer disposed on the first insulating layer; a second wiring layer disposed on the first insulating layer; a second insulating layer disposed on the first insulating layer; a third wiring layer disposed on the second insulating layer; a first cavity penetrating through at least a portion of the first insulating layer; and a second cavity penetrating through at least a portion of the second insulating layer and connected to the first cavity. The first and second cavities have different wall surface inclinations, and a depth of the first cavity is smaller than a thickness of the first insulating layer and is greater than a thickness of each of the first and second wiring layers.

20 Claims, 25 Drawing Sheets

100A

FIRST DIRECTION

SECOND DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

PRINTED CIRCUIT BOARD

CROSS-REFERENCE TO RELATED APPLICATION(S)

This application claims benefit of priority to Korean Patent Application No. 10-2023-0111014 filed on Aug. 24, 2023, in the Korean Intellectual Property Office, the disclosure of which is incorporated herein by reference in its entirety.

TECHNICAL FIELD

The present disclosure relates to a printed circuit board.

A thickness of components mounted on a package substrate is increasing due to improvements in smartphone performance, but a thickness of a set needs to be reduced or maintained. Accordingly, it is necessary to form a cavity having a considerable depth in the package substrate.

SUMMARY

An aspect of the present disclosure is to provide a printed circuit board in which a depth of a cavity may be easily adjusted, such as allowing the cavity to be formed to be deeper.

One solution proposed through the present disclosure is to use laser processing and metal etching methods together to form a plurality of cavities connected to each other.

For example, according to an aspect of the present disclosure, provided is a printed circuit board including: a first insulating layer having a first surface and a second surface opposing each other in a first direction; a first wiring layer disposed at the first surface of the first insulating layer; a second wiring layer disposed at the second surface of the first insulating layer; a second insulating layer having a third surface and a fourth surface opposing each other in the first direction, and disposed on the first insulating layer so that the third surface is connected to the second surface; a third wiring layer disposed at the fourth surface of the second insulating layer; a first cavity penetrating through at least a portion of the first insulating layer from the first surface in the first direction; and a second cavity penetrating through at least a portion of the second insulating layer in the first direction and connected to the first cavity. The first and second cavities may have different wall surface inclinations, and based on the first direction, a depth of the first cavity may be smaller than a thickness of the first insulating layer and may be greater than a thickness of each of the first and second wiring layers.

For example, according to an aspect of the present disclosure, provided is a printed circuit board including: a first insulating layer having a first cavity; first and second wiring layers respectively disposed on an upper surface and a lower surface of the first insulating layer; a second insulating layer disposed on a lower surface of the first insulating layer, covering at least a portion of the second wiring layer, and having a second cavity connected to the first cavity; and a third wiring layer disposed on a lower surface of the second insulating layer, wherein the first cavity may be disposed on a level between the first and second wiring layers.

One effect of the present disclosure is to provide a printed circuit board in which a depth of a cavity may be easily adjusted, such as allowing the cavity to be formed to be deeper.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
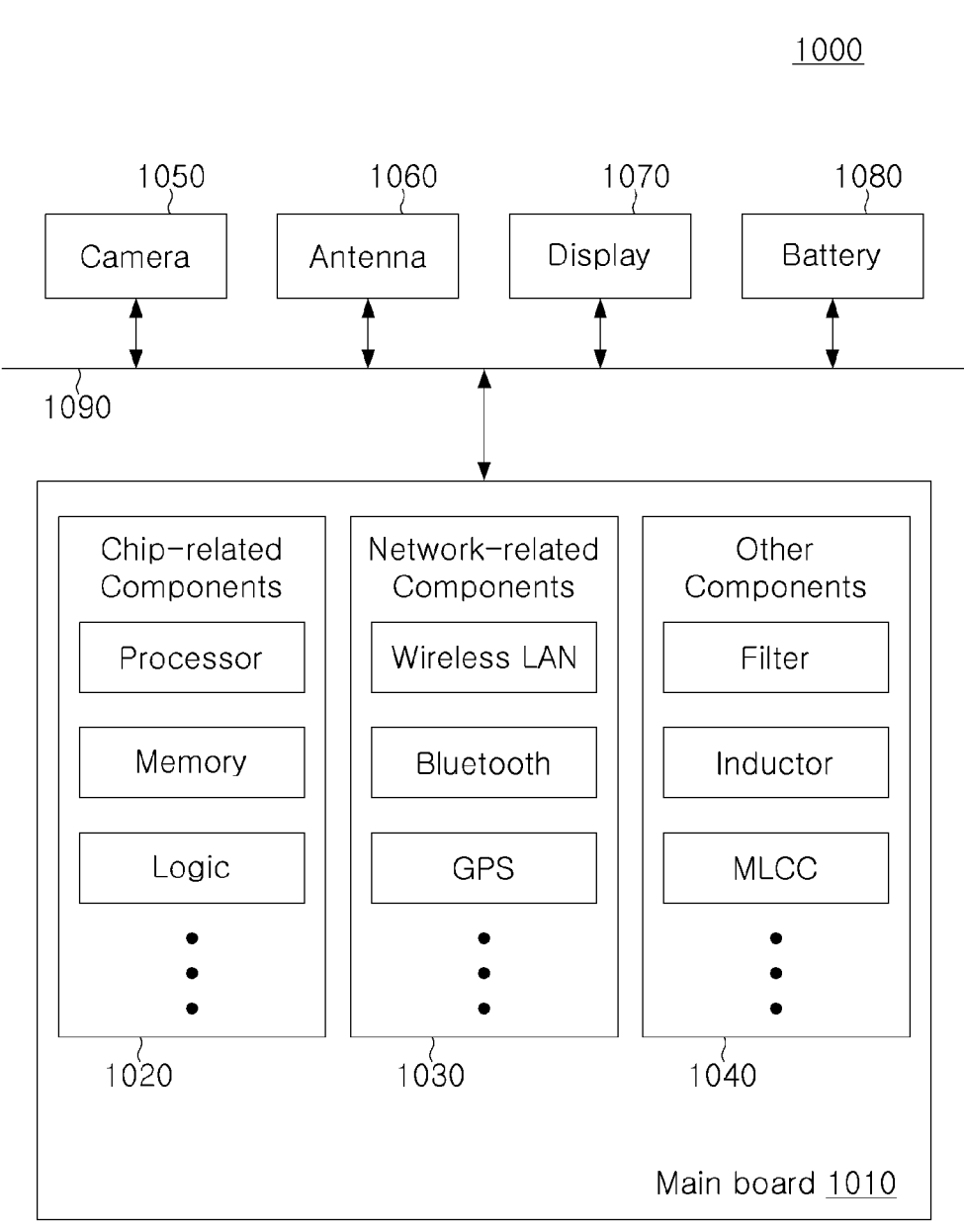
FIG. 1 is a block diagram schematically illustrating an example of an electronic device system.

Hereinafter, the present disclosure will be described with reference to the accompanying drawings. In the drawings, the shape and size of the elements may be exaggerated or reduced for clearer description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may have the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. In addition thereto, other electronic components used for various purposes depending on a type of electronic device 1000 may be included.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
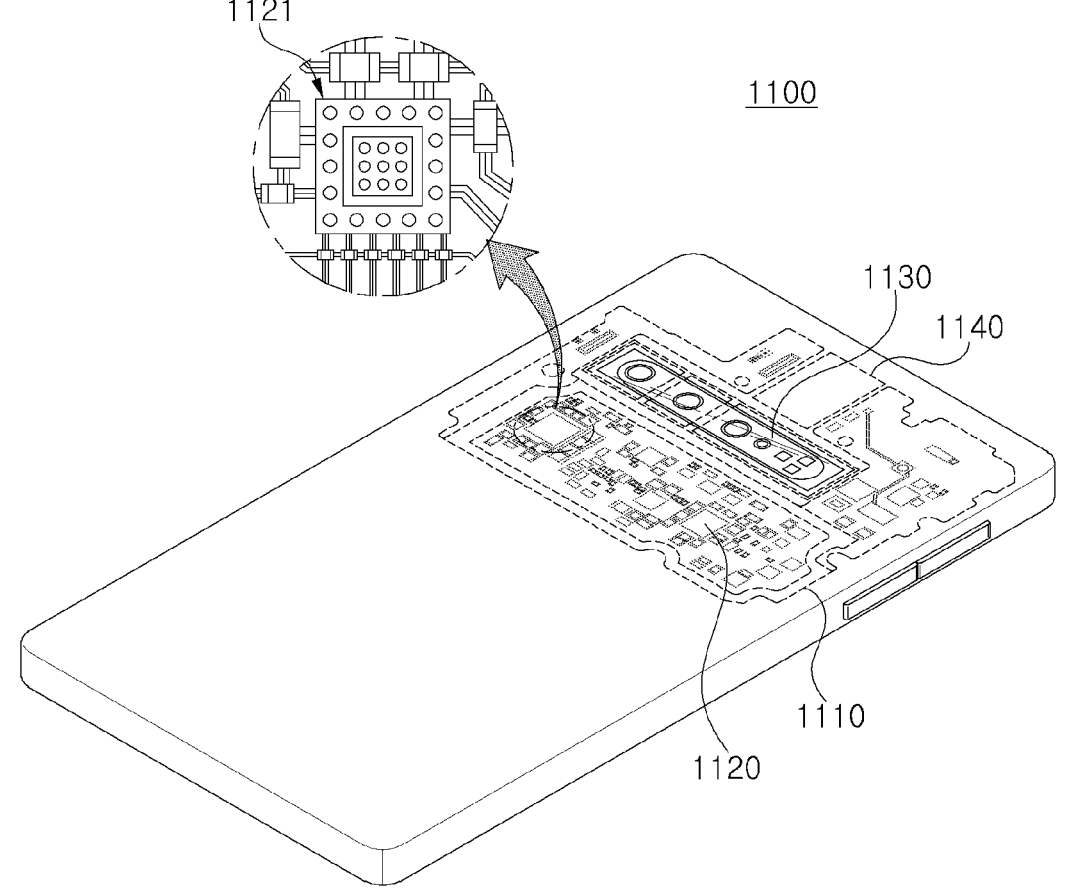
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A mother board 1110 may be accommodated in the smartphone 1100, and various components 1120 may be physically and/or electrically connected to the mother board 1110. Furthermore, other components that may or may not be physically and/or electrically connected to the mother board 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may have the form of a printed circuit board in which an electronic component including an active component and/or a passive component is mounted on a surface. Alternatively, the component package 1121 may have the form of a printed circuit board in which an active component and/or a passive component are embedded. On the other hand, the electronic device is not necessarily limited to the smartphone 1100, and may be other electronic devices as described above.

Printed Circuit Board

Figure 3:
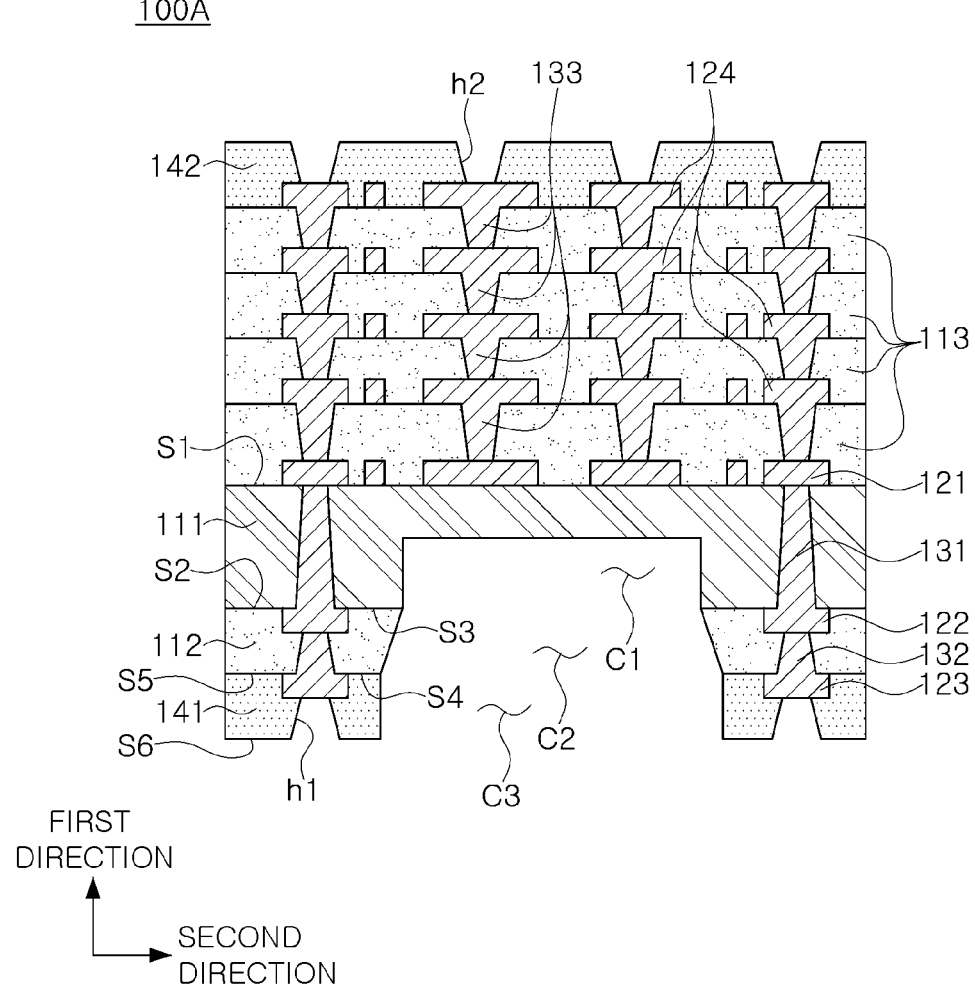
FIG. 3 is a cross-sectional view schematically illustrating an example of a printed circuit board.

FIG. 3 is a cross-sectional view schematically illustrating an example of a printed circuit board.

Referring to FIG. 3, a printed circuit board 100A according to an example embodiment may include a first insulating layer 111 having a first surface S1 and a second surface S2 opposing each other in a first direction, a first wiring layer 121 disposed on the first surface S1 of the first insulating layer 111, a second wiring layer 122 disposed on the second surface S2 of the first insulating layer 111, a second insulating layer 112 having a third surface S3 and a fourth surface S4 opposing each other in the first direction and disposed on the first insulating layer 111 so that the third surface S3 is connected to the second surface S2, a third wiring layer 123 disposed on the fourth surface S4 of the second insulating layer 112, a first cavity C1 penetrating through a portion of the first insulating layer 111 from the second surface S2 in the first direction, and a second cavity C2 penetrating through the second insulating layer 112 in the first direction and connected to the first cavity C1. The first and second cavities C1 and C2 may have different wall surface inclinations. Based on the first direction, a depth of the first cavity C1 may be smaller than a thickness of the first insulating layer 111 and may be thicker than a thickness of each of the first and second wiring layers 121 and 122. In the first direction, the first cavity C1 may be disposed on a level between the first and second wiring layers 121 and 122, and no wiring layer may be disposed between the first and second wiring layers 121 and 122.

For example, the first cavity C1 may be formed by etching a metal buried in the first insulating layer 111, and the second cavity C2 may be formed in the second insulating layer 112 through laser processing. Accordingly, the wall surface inclinations of the first and second cavities C1 and C2 may be different from each other. For example, the second cavity C2 may have a wall slope greater than that of the first cavity C1. For example, the first cavity C1 may have a substantially vertical wall surface, and the second cavity C2 may have a tapered wall surface on which a width of a side connected to the first cavity C1 is narrower than a width of an opposite side thereof on a cross-section. In this case, the first and second cavities C1 and C2 are connected so that a depth of an entire cavity may be increased, which may make it easier to control the depth of the cavity. Additionally, the second cavity C2 may have a larger average width on a cross-section than the first cavity C1. Accordingly, the cavity may become wider toward an entrance, and as a result, mounting components in the cavity may become easier. Additionally, the first cavity C1 may be formed by etching a metal block formed separately from the first and second wiring layers 121 and 122, and thus may be thinner than a thickness of the first insulating layer 111, but may be thicker than thicknesses of the first and second wiring layers 121 and 122. Additionally, the first cavity C1 may be disposed on a level between the first and second wiring layers 121 and 122. As a result, the first cavity C1 may be formed to have various thicknesses in a meaningful range. Accordingly, it may be easier to control a depth of the cavity.

Meanwhile, the printed circuit board 100A according to an example embodiment may further include a first resist layer 141 having a fifth surface S5 and a sixth surface S6 opposing each other in the first direction, disposed on the second insulating layer 112 so that the fifth surface S5 is connected to the fourth surface S4, and having a first opening h1 exposing at least a portion of the wiring layer 123, and a third cavity C3 penetrating through the first resist layer 141 in the first direction and connected to the second cavity C2. The second and third cavities C2 and C3 may have different wall surface inclinations. For example, the third cavity C3 may have a wall slope smaller than that of the second cavity C2. For example, the third cavity C3 may have a substantially vertical wall surface, or may have a tapered wall surface on which a width of a side connected to the second cavity C2 is narrower than a width of an opposite side thereof in a cross-section. In this case, the first to third cavities C1, C2 and C3 are connected to each other so that a depth of an entire cavity may be increased, which may make it easier to control the depth of the cavity. Additionally, the third cavity C3 may have a larger average width on a cross-section than the second cavity C2. Accordingly, an entrance to the cavity may be formed to be wider, and as a result, mounting components in the cavity may be easier. Additionally, since the third cavity C3 may be formed in a separate process from the first and second cavities C1 and C2, the depth of the cavity may be more easily adjusted.

Meanwhile, the printed circuit board 100A according to an example embodiment may further include a first via layer 131 penetrating through the first insulating layer 111 in the first direction and connecting at least a portion of each of the first and second wiring layers 121 and 122 to each other, and a second via layer 132 penetrating the second insulating layer 112 in the first direction and connecting at least a portion of each of the second and third wiring layers 122 and 123 to each other. Additionally, the printed circuit board 100A may further include a plurality of build-up insulating layers 113 disposed at the first surface S1 of the first insulating layer 111, a plurality of build-up wiring layers 121 and 124 respectively disposed on or in the plurality of build-up insulating layers 113 in a first direction and including the first wiring layer 121 described above, and a plurality of build-up via layers 133 respectively penetrating through at least one of the plurality of build-up insulating layers 113 in the first direction. Additionally, the printed circuit board 100A may further include a second resist layer 142 disposed on the plurality of build-up insulating layers 113 and having an opening h2 exposing at least a portion of the build-up wiring layer 124 disposed on an outermost side, for example, a lowermost side with respect to the first direction, among the plurality of build-up wiring layers 121 and 124. As described above, the printed circuit board 100A according to an example may have a structure of a multilayer coreless board. A bottom surface of the first cavity C1 may be disposed on a level between the first surface S1 and the second surface S2 of the first insulating layer 111.

Hereinafter, components of the printed circuit board 100A according to an example will be described in more detail with reference to the drawings.

Each of the first and second insulating layers 111 and 112 and the plurality of build-up insulating layers 113 may include an insulating material. The insulating material may include a thermosetting resin such as an epoxy resin, a thermoplastic resin such as polyimide, or a material including an inorganic filler, an organic filler, and/or a glass fiber (Glass Fiber, Glass Cloth or Glass Fabric) along with resins. For example, the insulating material may be a non-photo-sensitive insulating material such as an Ajinomoto Build-up Film (ABF) or Prepreg (PPG), but the present disclosure is not limited thereto, and other polymer materials may be used as the insulating material. The first and second insulating layers 111 and 112 and the plurality of build-up insulating layers 113 may include the same insulating material or may include different insulating materials. The first and second insulating layers 111 and 112 and the plurality of build-up insulating layers 113 may have boundaries with each other, or may be integrated to the extent that the boundaries are unclear. Based on the first direction, the first insulating layer 111 may be thicker than the second insulating layer 112, but the present disclosure is not limited thereto.

Each of the first to third wiring layers 121, 122 and 123 and the plurality of build-up wiring layers 121 and 124 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first to third wiring layers 121, 122, and 123 and the plurality of build-up wiring layers 121 and 124 may perform various functions depending on the design. For example, the first to third wiring layers 121, 122, and 123 and the plurality of build-up wiring layers 121 and 124 may include a signal pattern, a power pattern, and a ground pattern. Each of these patterns may have various forms such as a line, a plane, and a pad. Each of the first to third wiring layers 121, 122 and 123 and the plurality of build-up wiring layers 121 and 124 may include an electroless plating layer (or chemical copper) and an electrolytic plating layer (or electrolytic copper). Alternatively, the first to third wiring layers 121, 122 and 123 and the plurality of build-up wiring layers 121 and 124 may include a metal foil (or copper foil) and an electrolytic plating layer (or electrolytic copper). Alternatively, the first to third wiring layers 121, 122 and 123 and the plurality of build-up wiring layers 121 and 124 may include a metal foil (or copper foil), an electroless plating layer (or chemical copper), and an electrolytic plating layer (or electrolytic copper). The first to third wiring layers 121, 122 and 123 and the plurality of build-up wiring layers 121 and 124 may include a sputtering layer instead of an electroless plating layer (or chemical copper), and may both the sputtering layer and the electroless plating layer (or chemical copper) if necessary.

Each of the first and second via layers 131 and 132 and the plurality of build-up via layers 133 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first and second via layers 131 and 132 and the plurality of build-up via layers 133 may include a microvia. The microvia may be a filled via filling a via hole or a conformal via disposed along a wall surface of the via hole. The microvia may be disposed as a stacked type and/or a staggered type. The microvias of the first and second via layers 131 and 132 and the plurality of build-up via layers 133 may perform various functions depending on the design of the corresponding layer. For example, the first and second via layers 131 and 132 and the plurality of build-up via layers 133 may include a ground vias, a power via, and a signal via. Each of the third and fourth via layers 133 and 134 may include an electroless plating layer (or chemical copper) and an electrolytic plating layer (or electrolytic copper), but the present disclosure is not limited thereto. The third and fourth via layers 133 and 134 may have a sputtering layer formed therein instead of an electroless plating layer, and may include both the sputtering layer and the electroless plating layer. The microvias of each of the first and second via layers 131 and 132 may have a shape tapered in the same direction. Each microvia of the plurality of build-up via layers 133 may have a shape tapered in the same direction. The microvias of the first and second via layers 131 and 132 and the plurality of build-up via layers 133 may have a shape tapered in opposite directions.

Each of the first and second resist layers 141 and 142 may include a liquid or film-type solder resist, but is not limited thereto, and may include other types of insulating materials such as ABF. The first and second resist layers 141 and 142 may have first and second openings h1 and h2, respectively, and a surface treatment layer may be formed on a pattern exposed through the first and second openings h1 and h2 as necessary.

Figure 4:
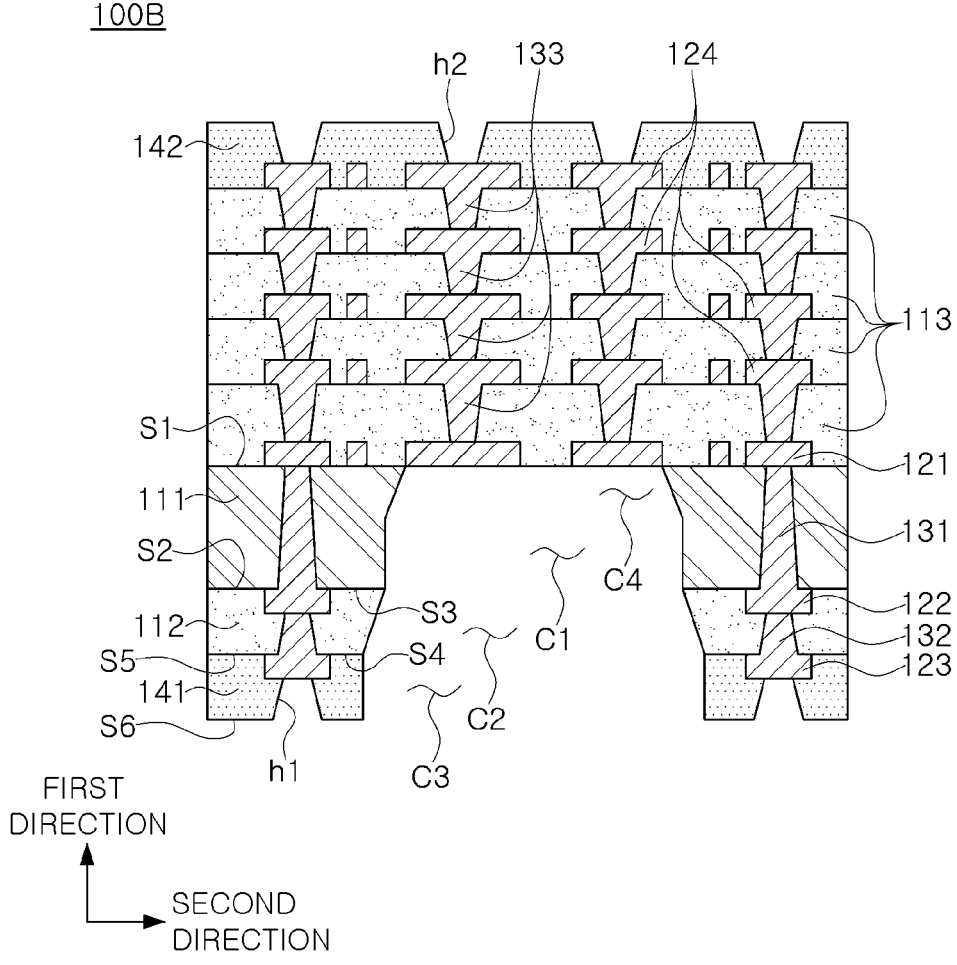
FIG. 4 is a cross-sectional view schematically illustrating a modified example embodiment of the printed circuit board of FIG. 3.

FIG. 4 is a cross-sectional view schematically illustrating a modified example embodiment of the printed circuit board of FIG. 3.

Referring to FIG. 3, a printed circuit board 100B according to a modified example embodiment may further include a fourth cavity C4 penetrating through another portion of the first insulating layer 111 from the first cavity C1 in the first direction and connected to the first cavity C1, in the printed circuit board 100A according to the above-described example embodiment. The fourth cavity C4 may expose at least one of the plurality of build-up wiring layers 121 and 124, for example, at least a portion of the first wiring layer 121. The first and fourth cavities C1 and C4 may have different wall surface inclinations. For example, the fourth cavity C4 may have a wall surface inclination larger than that of the first cavity C1. For example, the first cavity C1 may have a substantially vertical wall surface, and the fourth cavity C4 may have a tapered wall on which a width of a side connected to the first cavity C1 is larger than a width of an opposite side thereof on a cross-section. In this case, the first to fourth cavities C1, C2, C3 and C4 may be connected to each other so that a depth of an entire cavity may be increased, which may make it easier to control the depth of the cavity. Additionally, the first cavity C1 may have a larger average width on a cross-section than the fourth cavity C4. Accordingly, the cavity may become wider toward an entrance, and as a result, mounting components in the cavity may become easier. Additionally, the fourth cavity C4 may be formed in a separate process from the first cavity C1, which may make it easier to adjust the depth of the cavity.

Other contents are substantially the same as those described in the printed circuit board 100A according to the above-described example embodiment, and thus, redundant descriptions thereof will be omitted.

FIGS. 5A to 5J are process cross-sectional views schematically illustrating an example of manufacturing the printed circuit board of FIGS. 3 and 4.

Figure 5A:
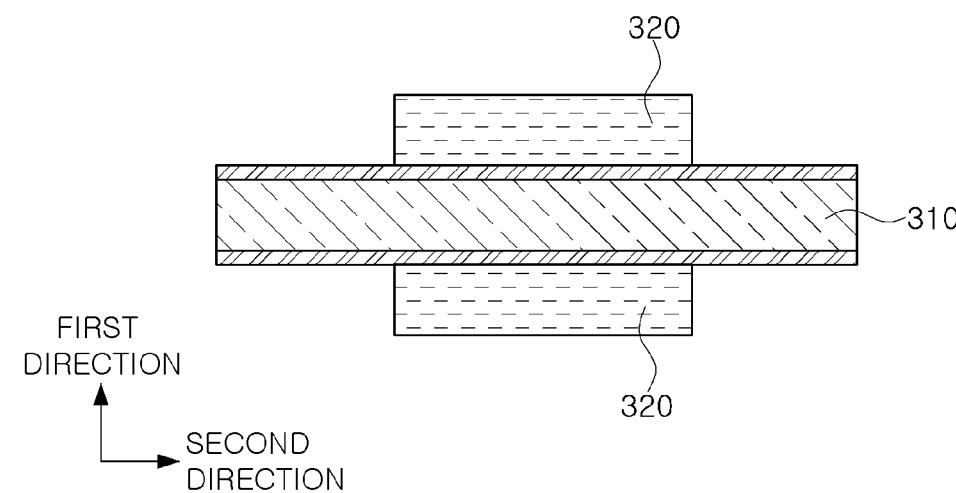
FIGS. 5A to 5J are process cross-sectional views schematically illustrating an example of manufacturing the printed circuit board of FIGS. 3 and 4.

Referring to FIG. 5A, metal blocks 320 are formed on both surfaces of a detach carrier 310 based on the first direction. Copper foil may be disposed on both surfaces of the detach carrier 310, and the metal block 320 may be formed using the copper foil as a seed layer, for example, through electrolytic plating.

Figure 5B:
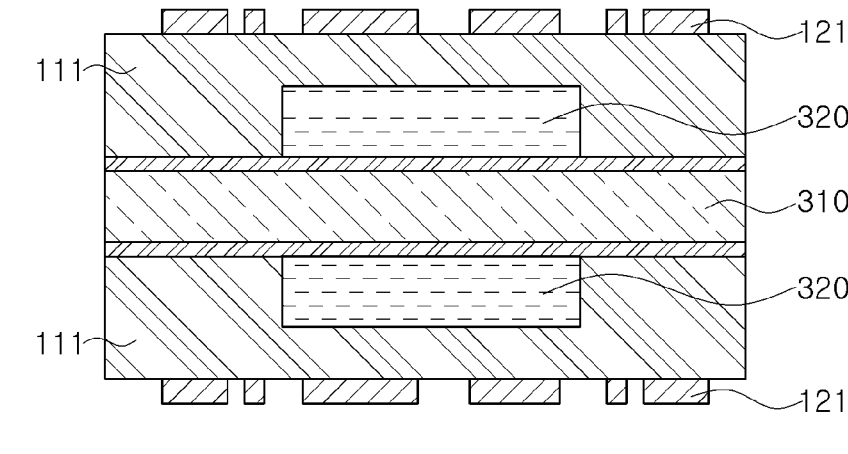
Figure 5B:
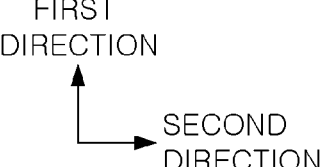

Referring to FIG. 5B, a first insulating layer 111 burying the metal block 320 is formed on both surfaces of the detach carrier 310. The first insulating layer 111 may be formed to be thicker than the metal block 320. The first insulating layer 111 may be formed in a lamination process. Additionally, the first wiring layer 121 is formed on the first insulating layer 111 in a plating process. For example, the first wiring layer 121 may be formed using an Additive Process (AP), a Semi AP (SAP), a Modified SAP (MSAP), Tenting (TT), or the like.

Figure 5C:
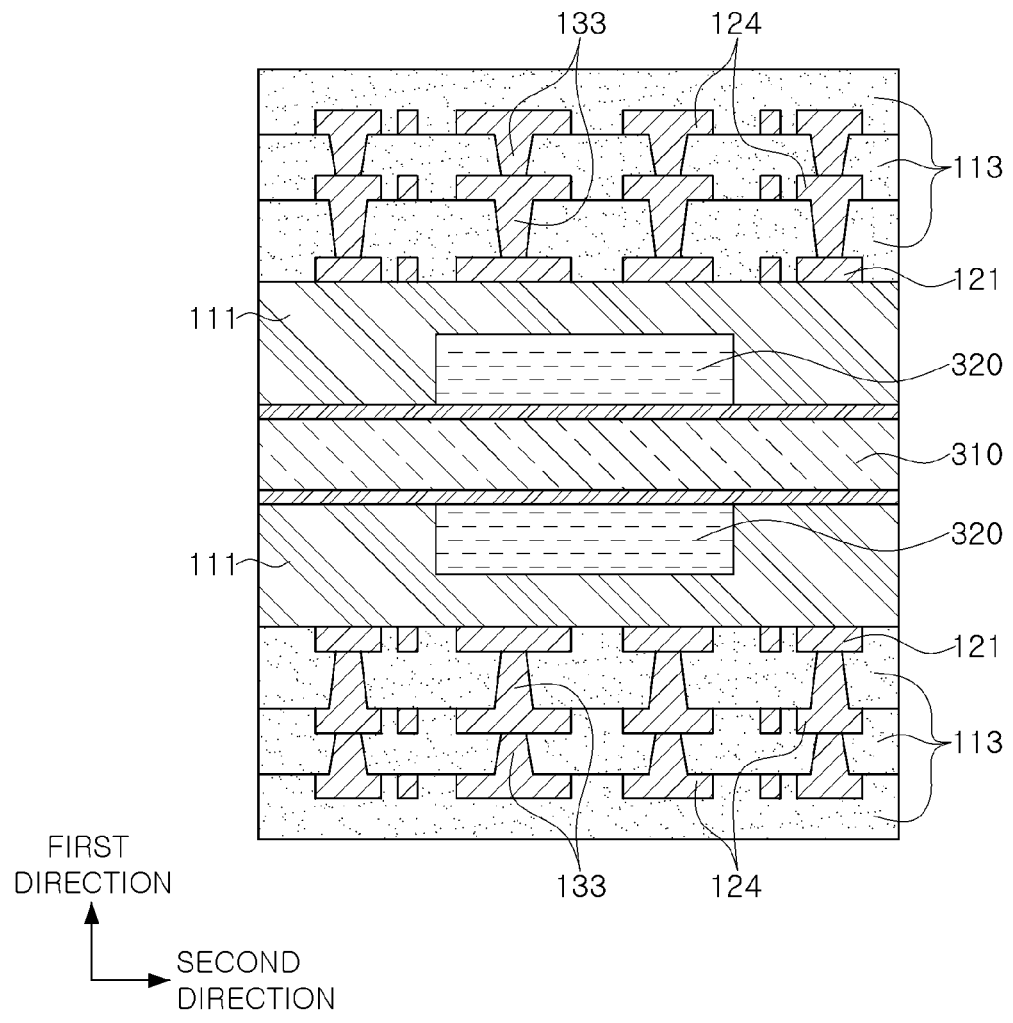

Referring to FIG. 5C, a plurality of build-up insulating layers 113, a plurality of build-up wiring layers 121 and 124, and a plurality of build-up via layers 133 are formed on the first insulating layer 111. The build-up insulating layer 113, the plurality of build-up wiring layers 121 and 124, and the plurality of build-up via layers 133 may be formed in a build-up process. The build-up insulating layer 113 may be formed in a lamination process. The plurality of build-up wiring layers 121 and 124 and the plurality of build-up via layers 133 may be formed in a plating process. In this case, via hole processing may be performed using a laser drill or mechanical drill.

Figure 5D:
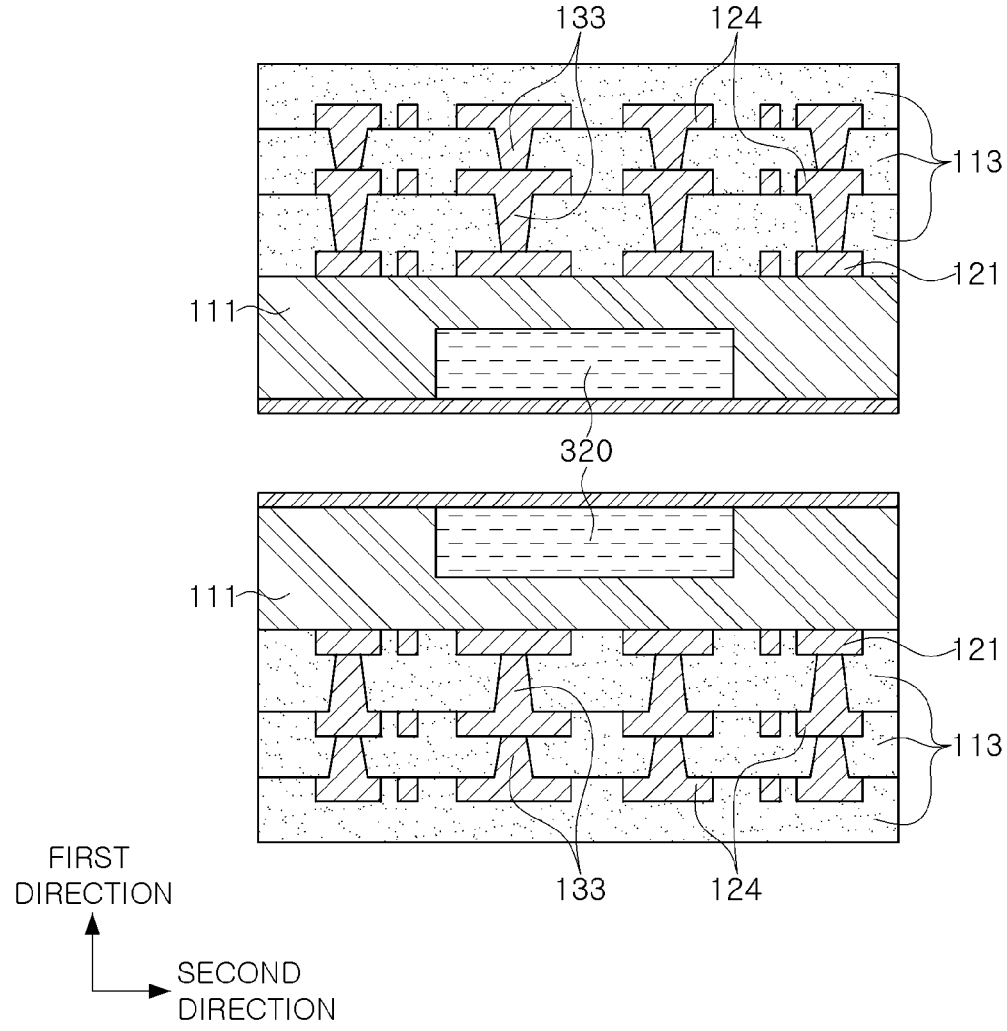

Referring to FIG. 5D, a manufactured stack is separated from the detach carrier 310. In this case, the copper foil of the detach carrier 310 may remain in the stack if necessary.

Figure 5E:
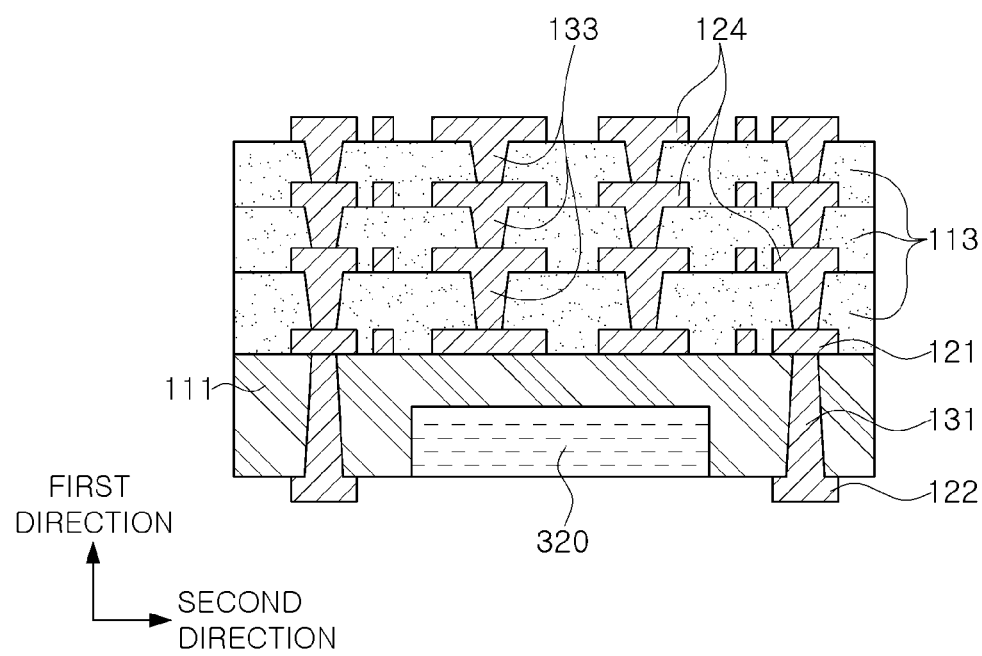

Referring to FIG. 5E, a build-up process is further performed to form the second wiring layer 122 and the first via layer 131 on the first insulating layer 111. Additionally, a build-up wiring layer 124 and a build-up via layer 133 are further formed on an outermost side of the laminate.

Figure 5F:
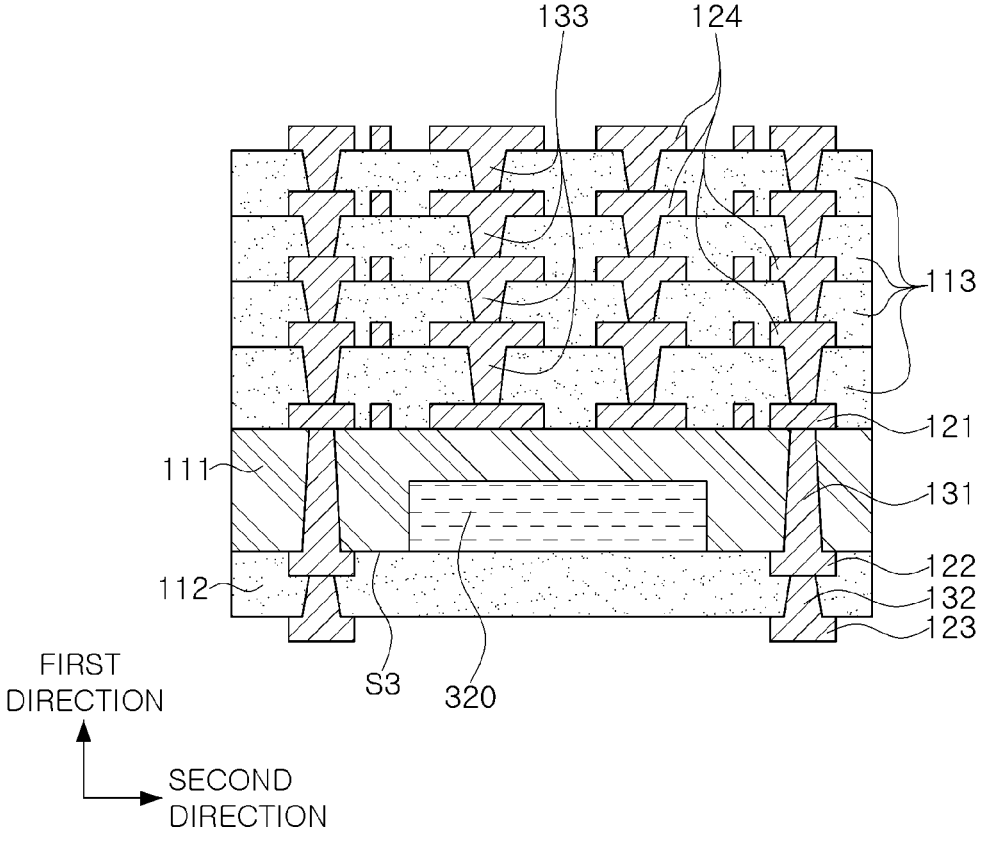

Referring to FIG. 5F, a build-up process is further performed to form a second insulating layer 112 on the first insulating layer 111. Additionally, a third wiring layer 123 and a second via layer 132 are formed on the second insulating layer 112.

Figure 5G:
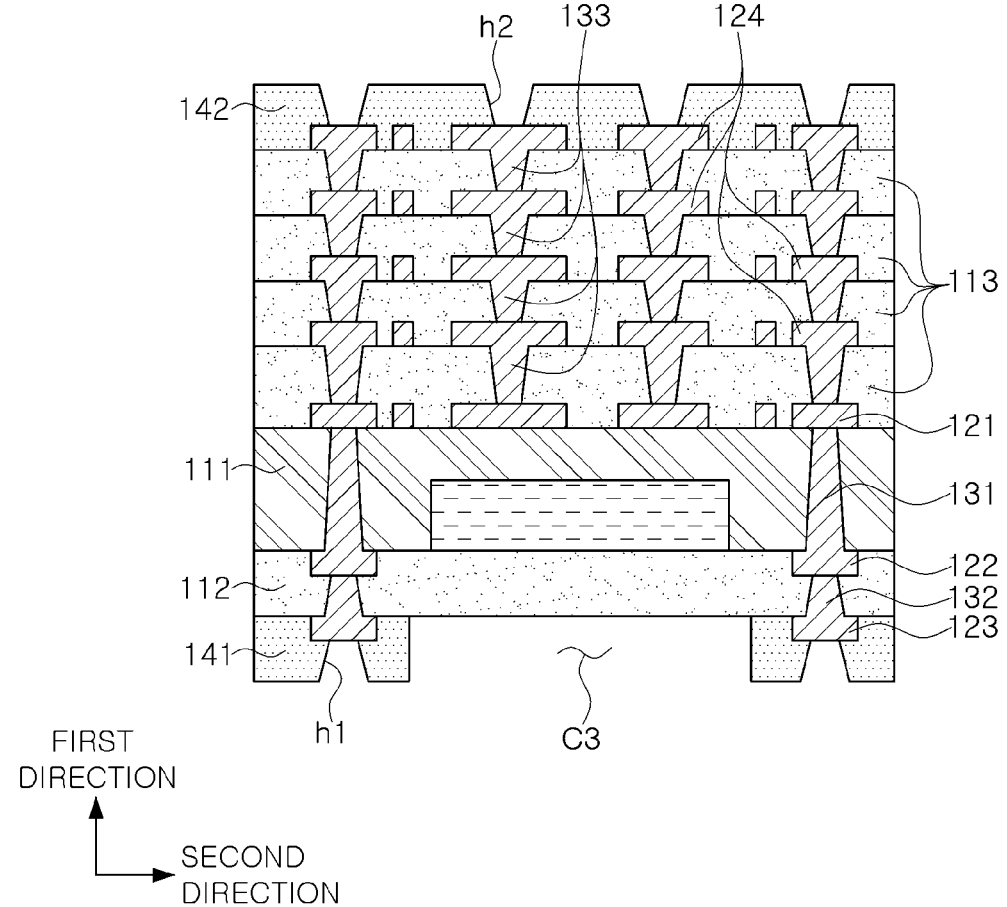

Referring to FIG. 5G, first and second resist layers 141 and 142 are formed on both surfaces of the stack. The first and second resist layers 141 and 142 may be formed by coating or lamination. Next, first and second openings h1 and h2 and a third cavity C3 are formed in the first and second resist layers 141 and 142. Each of the first and second openings h1 and h2 and the third cavity C3 may be formed by laser processing, but the present disclosure is not limited thereto, and other methods such as etching may be used.

Figure 5H:
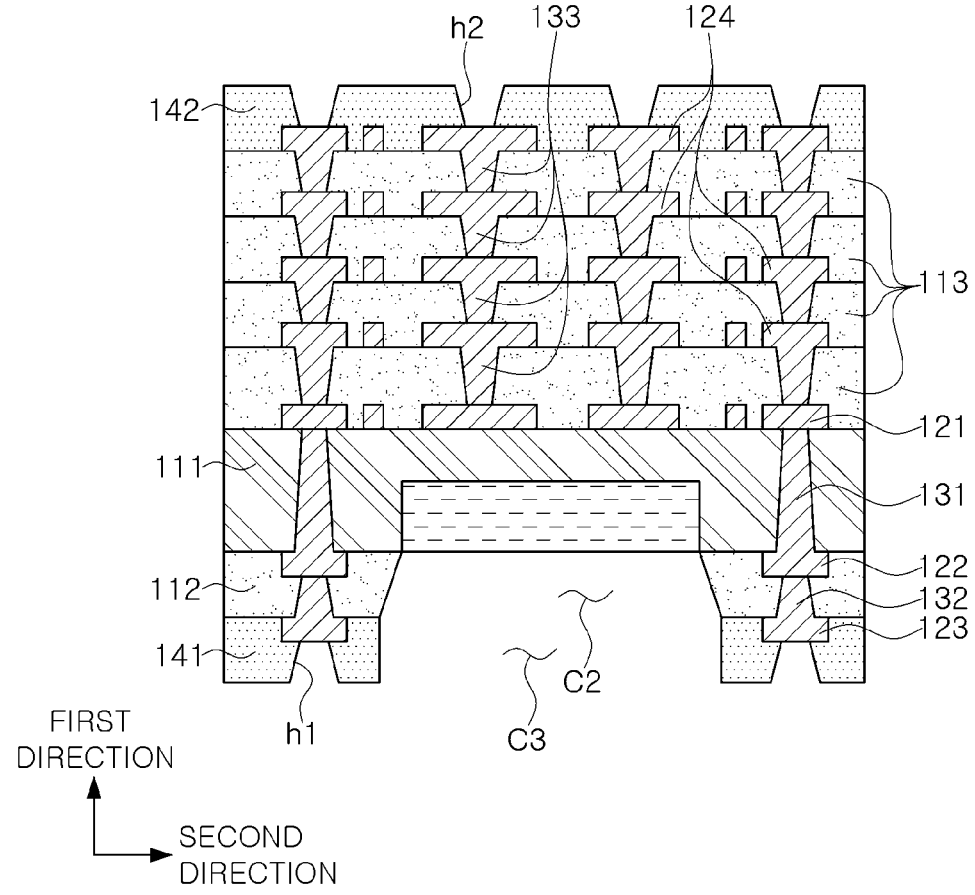

Referring to FIG. 5H, a second cavity C2 is formed in the second insulating layer 112. The second cavity C2 may be formed through laser processing. For example, the second cavity C2 may be formed by processing the second insulating layer 112 exposed from the third cavity C3 with a laser, and a metal block 320 buried in the first insulating layer 111 may be exposed.

Figure 5I:
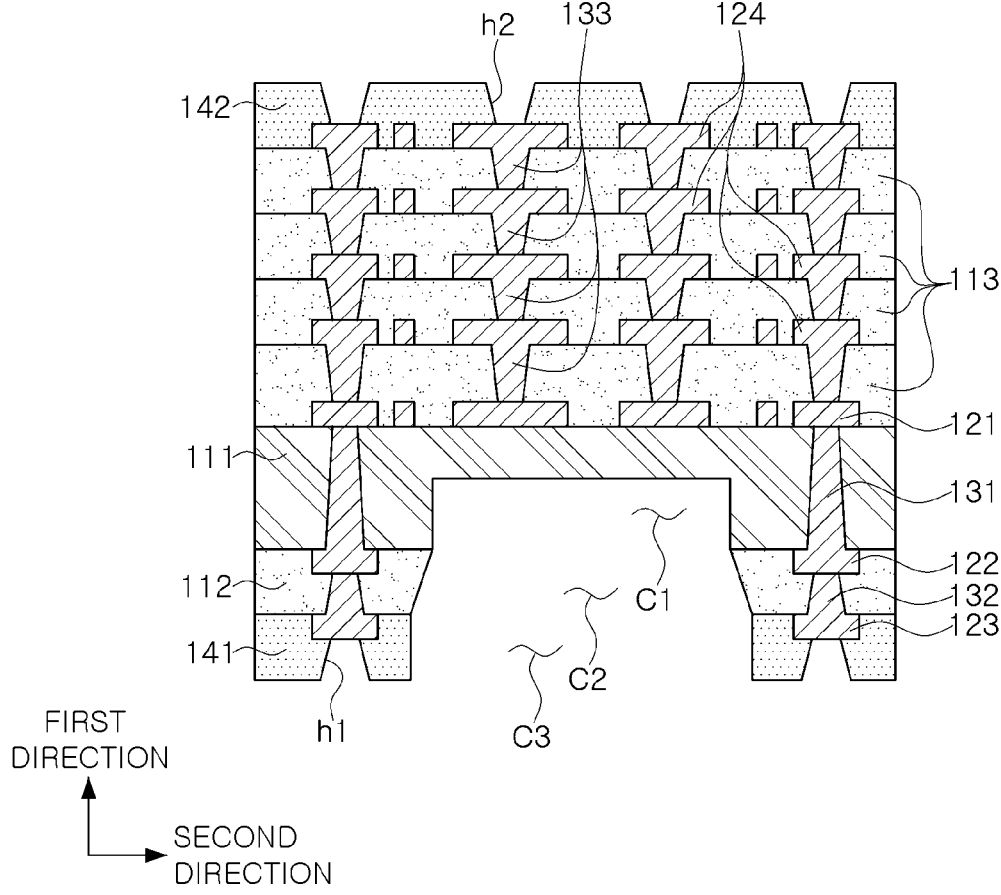

Referring to FIG. 5I, a first cavity C1 is formed in the first insulating layer 111. The first cavity C1 may be formed by removing the metal block 320 by etching. Through a series of processes, the printed circuit board 100A according to the above-described example embodiment may be manufactured.

Figure 5J:
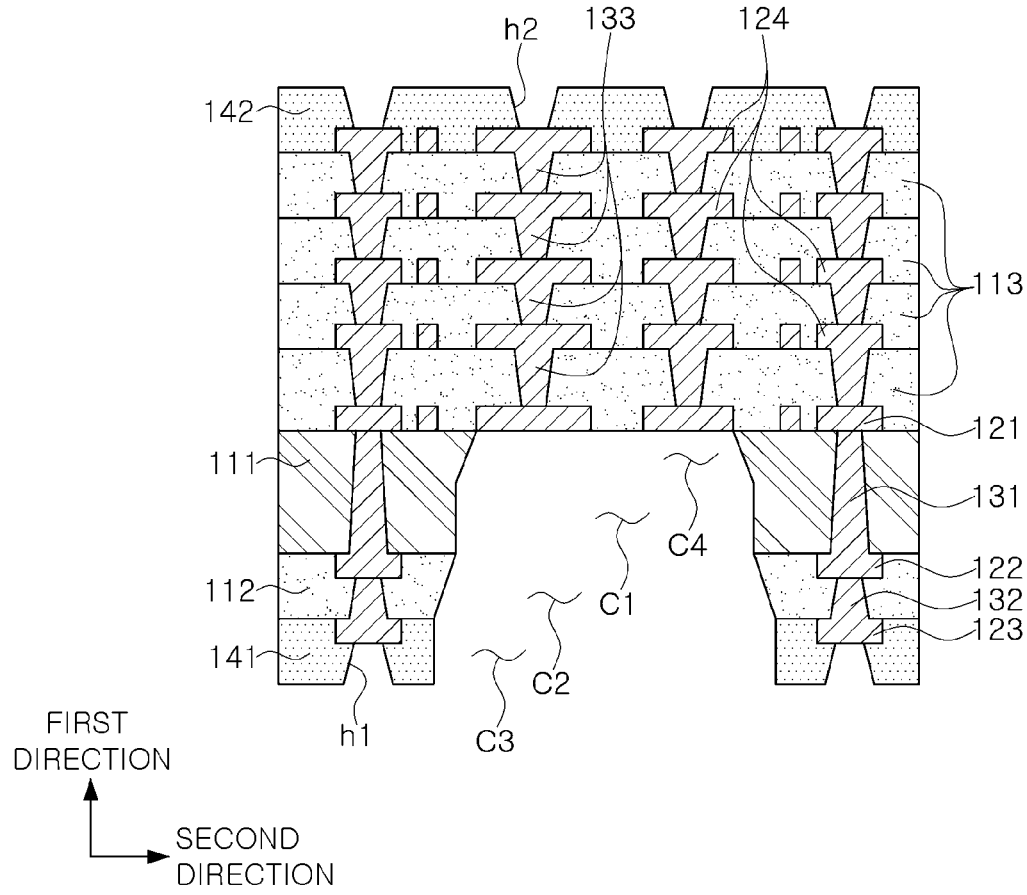

Referring to FIG. 5J, a fourth cavity C4 is formed in the first insulating layer 111. The fourth cavity C4 may be formed through laser processing. For example, the fourth cavity C4 may be formed by processing the first insulating layer 111 exposed from the first to third cavities C1, C2 and C3 with a laser, and may expose a portion of the first wiring layer 121. Through a series of processes, the printed circuit board 100B according to the above-described modified example embodiment may be manufactured.

Other contents are substantially the same as those described in the printed circuit board 100A according to the above-described example embodiment and the printed circuit board 100B according to the modified example embodiment thereof, and thus, redundant descriptions thereof will be omitted.

Figure 6:
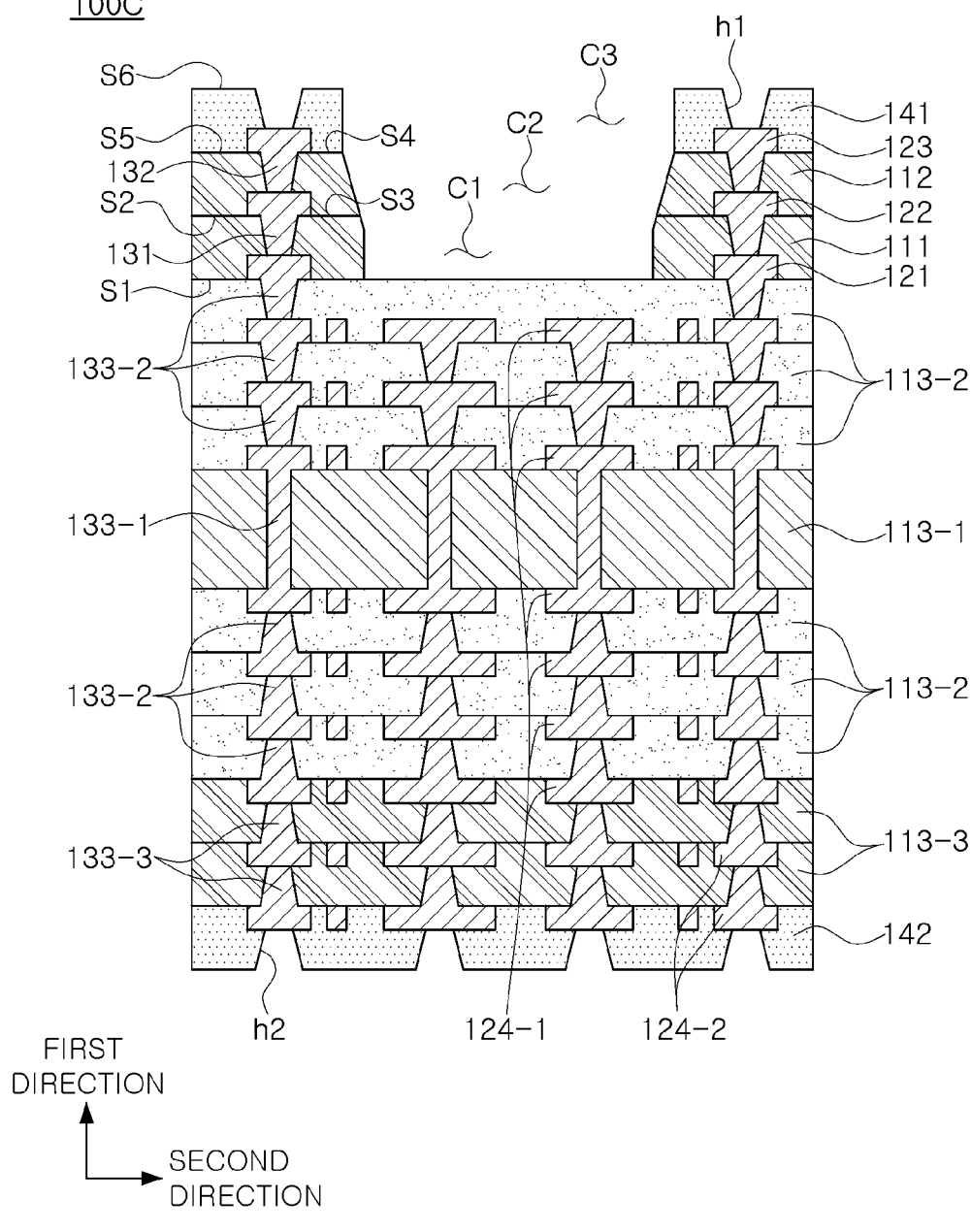
FIG. 6 is a cross-sectional view schematically illustrating another example embodiment of a printed circuit board.

FIG. 6 is a cross-sectional view schematically illustrating another example embodiment of a printed circuit board.

Referring to FIG. 6, in a printed circuit board 100C according to another example embodiment, the first to third wiring layers 121, 122 and 123 and the first and second cavities C1 and C2 may have different shapes in terms of the printed circuit board 100A according to the above-described example embodiment. For example, the first wiring layer 121 may be buried at the first surface S1 of the first insulating layer 111, and the second wiring layer 122 may be disposed on the second surface S2 of the first insulating layer 111. Additionally, the first cavity C1 may penetrate through a portion of the first insulating layer 111 from the first surface S1 in the first direction, and the second cavity C2 may be connected to the first cavity C1 by penetrating through the second insulating layer 112 in the first direction and further penetrating through another portion of the first insulating layer 111 from the second surface S2 to the first cavity C1. However, similarly, the first and second cavities C1 and C2 may have different wall surface inclinations, and based on the first direction, a depth of the first cavity C1 may be smaller than a thickness of the first insulating layer 111, and may be thicker than thicknesses of each of the first and second wiring layers 121 and 122.

Additionally, in a printed circuit board 100C according to another example embodiment, a plurality of build-up insulating layers 113-1, 113-2 and 113-3, a plurality of build-up wiring layers 121, 124-1 and 124-2, and a plurality of build-up via layers 133-1, 113-2 and 113-3 may have a structure of a multilayer core substrate rather than a multilayer coreless substrate in terms of the printed circuit board 100A according to the above-described example embodiment. For example, the plurality of build-up insulating layers 113-1, 113-2 and 113-3 may include a core insulating layer 113-1 in a central portion thereof, and the core insulating layer 113-1 may be formed of Copper Clad Laminate (CCL) or another core insulating material. Based on the first direction, the core insulating layer 113-1 may be thicker than each of the other build-up insulating layers 113-2 and 113-3. Additionally, the plurality of build-up via layers 133-1, 133-2 and 133-3 may include a core via layer 133-1 penetrating through the core insulating layer 113-1, and the core via layer 133-1 may include a through-via. The through-via may include a Plated Through-Hole (PTH) formed by filling a through-hole with the above-described metallic material, or generated in a manner in which the above-described metallic material is formed conformally by plating on a wall surface of the through-hole and an inside of the through-hole is filled with an insulating material. The through-via may have a rectangular or hourglass shape on a cross-section, but the present disclosure is not limited thereto. A bottom surface of the first cavity C1 may be provided through an exposed surface of the plurality of build-up insulating layers 113-2.

Other contents are substantially the same as those described in the printed circuit board 100A according to the above-described example embodiment, and thus, redundant descriptions thereof will be omitted.

Figure 7:
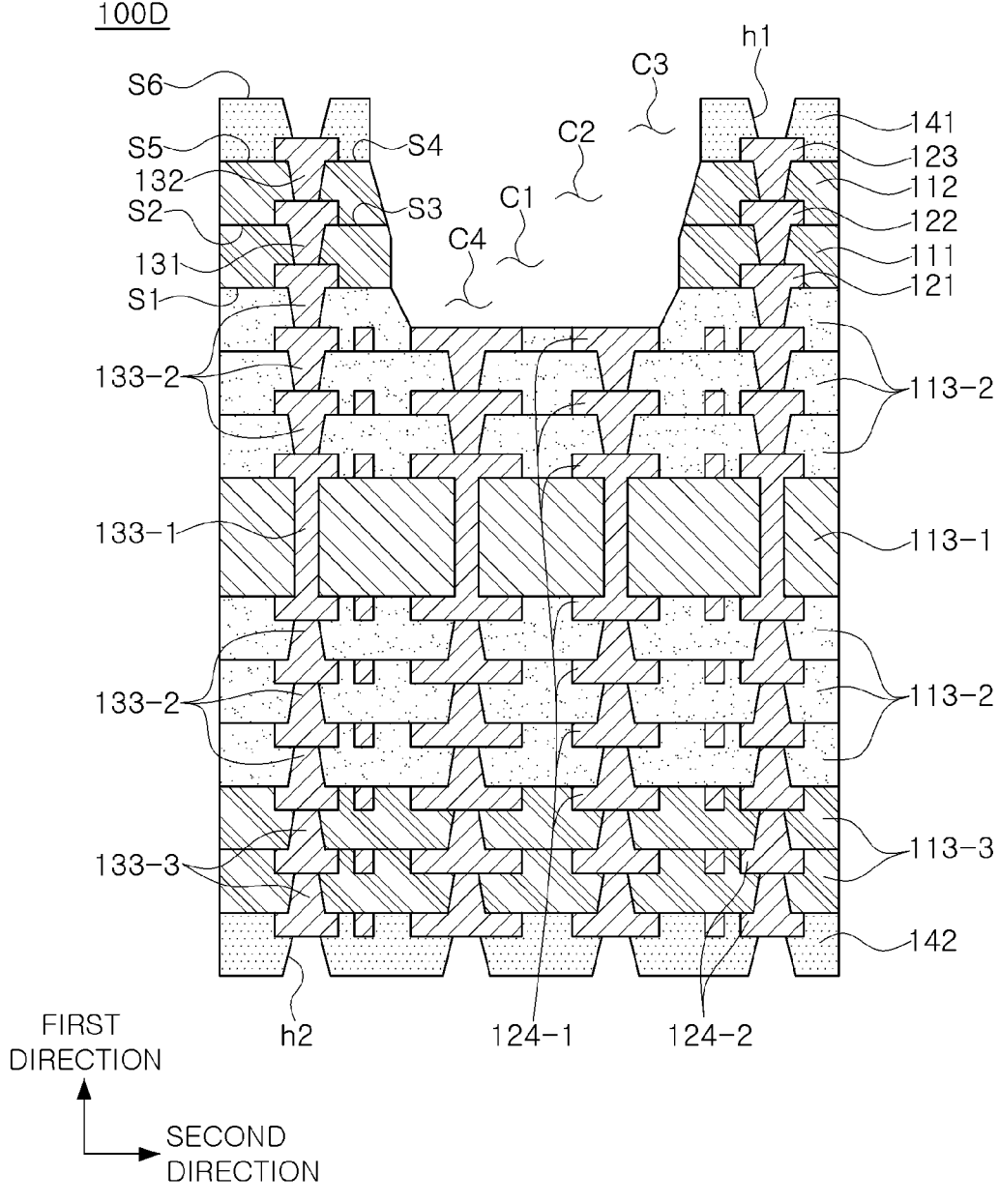
FIG. 7 is a cross-sectional view schematically illustrating a modified example embodiment of the printed circuit board of FIG. 6.

FIG. 7 is a cross-sectional view schematically illustrating a modified example embodiment of the printed circuit board of FIG. 6.

Referring to FIG. 7, a printed circuit board 100D according to a modified example embodiment may further include a fourth cavity C4 penetrating through at least one build-up insulating layer 113-2 among the plurality of build-up insulating layers 113-1, 113-2 and 113-3 in the first direction and connected to the first cavity C1. The fourth cavity C4 may expose at least a portion of at least one build-up wiring layer 124-1 among the plurality of build-up wiring layers 121, 124-1 and 124-2. The first and fourth cavities C1 and C4 may have different wall surface inclinations. For example, the fourth cavity C4 may have a wall surface inclination greater than that of the first cavity C1. For example, the first cavity C1 may have a substantially vertical wall surface, and the fourth cavity C4 may have a tapered wall on which a width of a side connected to the first cavity C1 is larger than a width of an opposite side thereof on a cross-section.

Other contents are substantially the same as those described in the printed circuit board 100A according to the above-described example embodiment, the printed circuit board 100B according to the modified example embodiment thereof, and the printed circuit board 100C according to another example embodiment described above, and thus, redundant descriptions thereof will be omitted.

FIGS. 8A to 8H are process cross-sectional views schematically illustrating an example of manufacturing the printed circuit board of FIGS. 6 and 7.

Figure 8A:
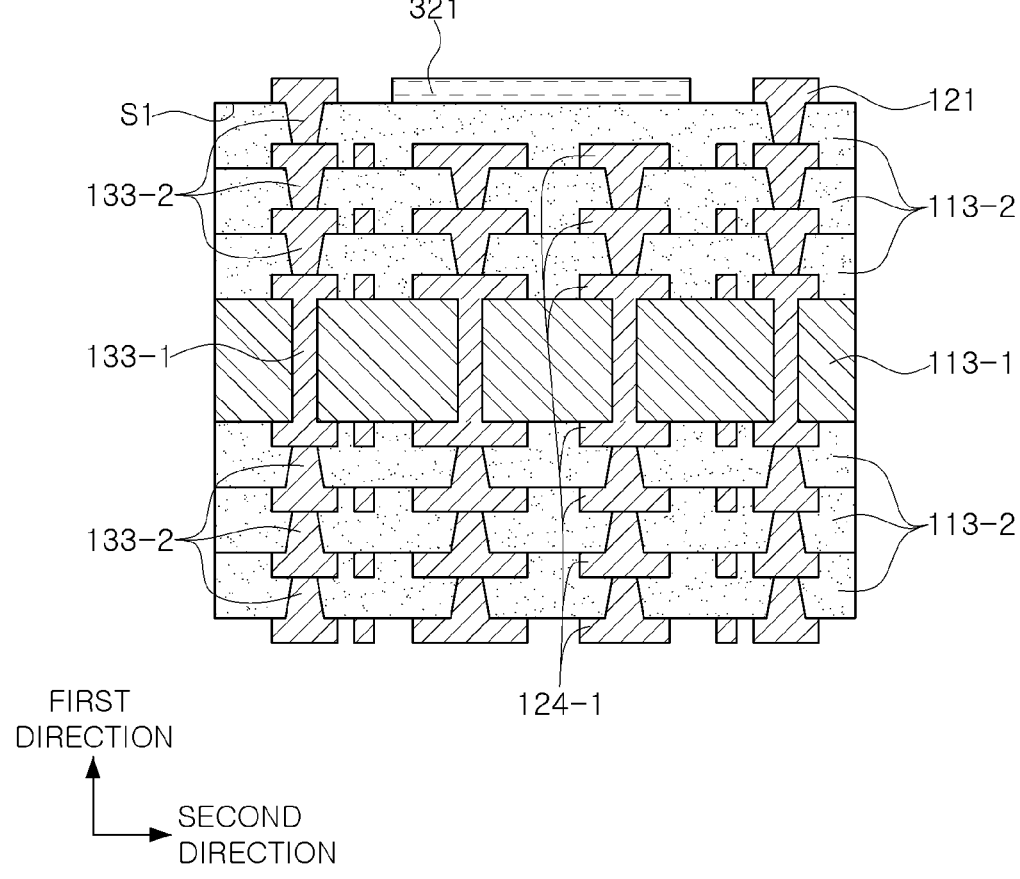
FIGS. 8A to 8H are process cross-sectional views schematically illustrating an example of manufacturing the printed circuit board of FIGS. 6 and 7.

Referring to FIG. 8A, a double-sided build-up process is performed based on a core insulating layer 113-1, thereby forming a stack having a multilayer core substrate including a plurality of build-up insulating layers 113-1 and 113-2, a plurality of build-up wiring layers 121 and 124-1 and a plurality of build-up via layers 113-1 and 113-2. Additionally, a first metal block 321 is formed in a plating process on a build-up insulating layer 113-2 disposed on an outermost side, for example, an uppermost side, among the plurality of build-up insulating layers 113-1 and 113-2 based on the first direction.

Figure 8B:
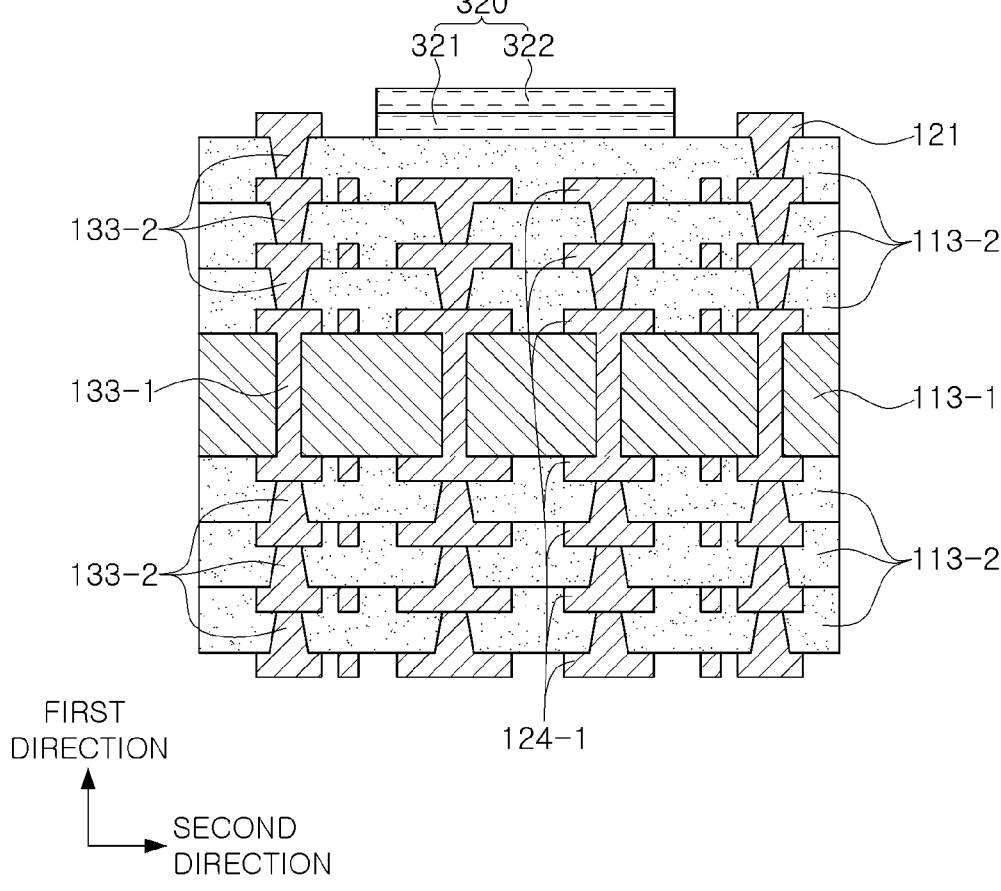

Referring to FIG. 8B, a second metal block 322 is further formed on the first metal block 321 in a plating process, thereby forming a metal block 320 thicker than the first wiring layer 121 in the first direction.

Figure 8C:
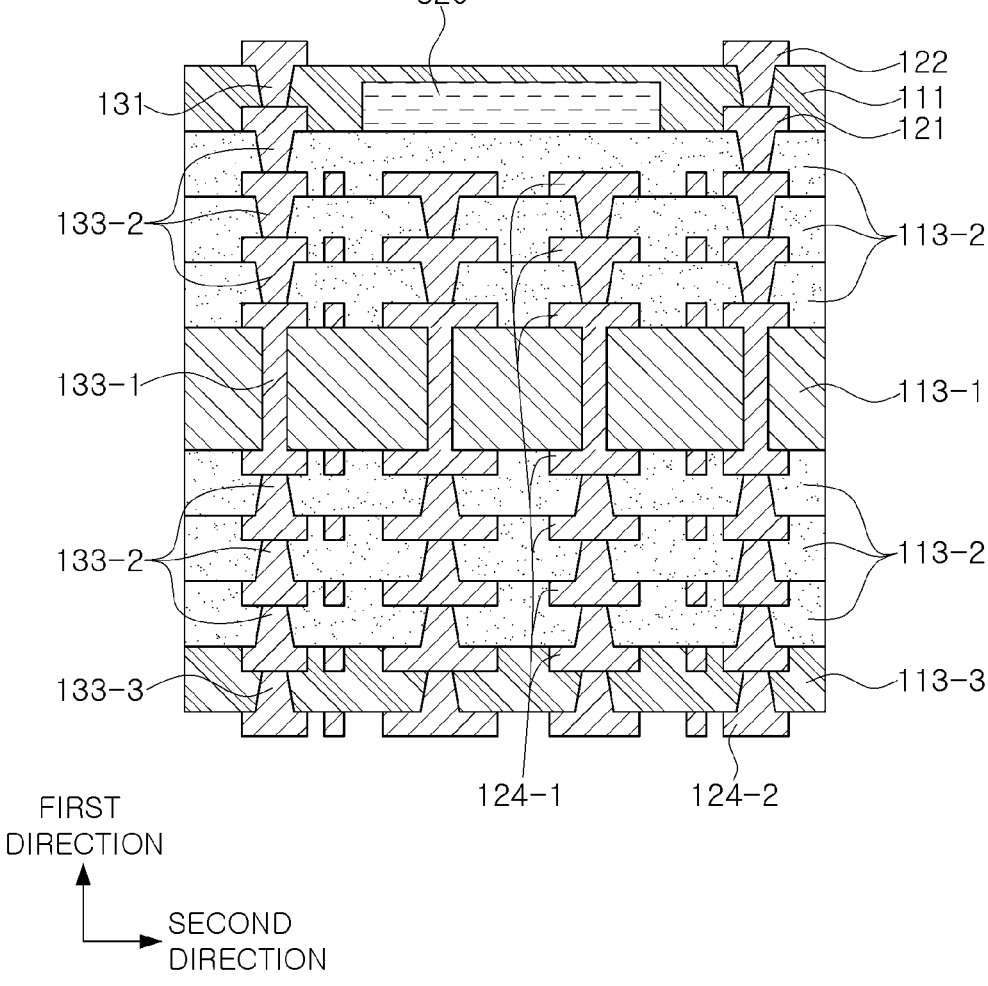

Referring to FIG. 8C, a first insulating layer 111 burying the metal block 320 is formed on the plurality of build-up insulating layers 113-1 and 113-2 in a build-up process. Additionally, a second wiring layer 122 and a first via layer 131 are formed on the first insulating layer 111. In this case, a build-up insulating layer 113-3, a build-up wiring layer 124-2, and a build-up via layer 133-3 are further formed on an opposite side thereof.

Figure 8D:
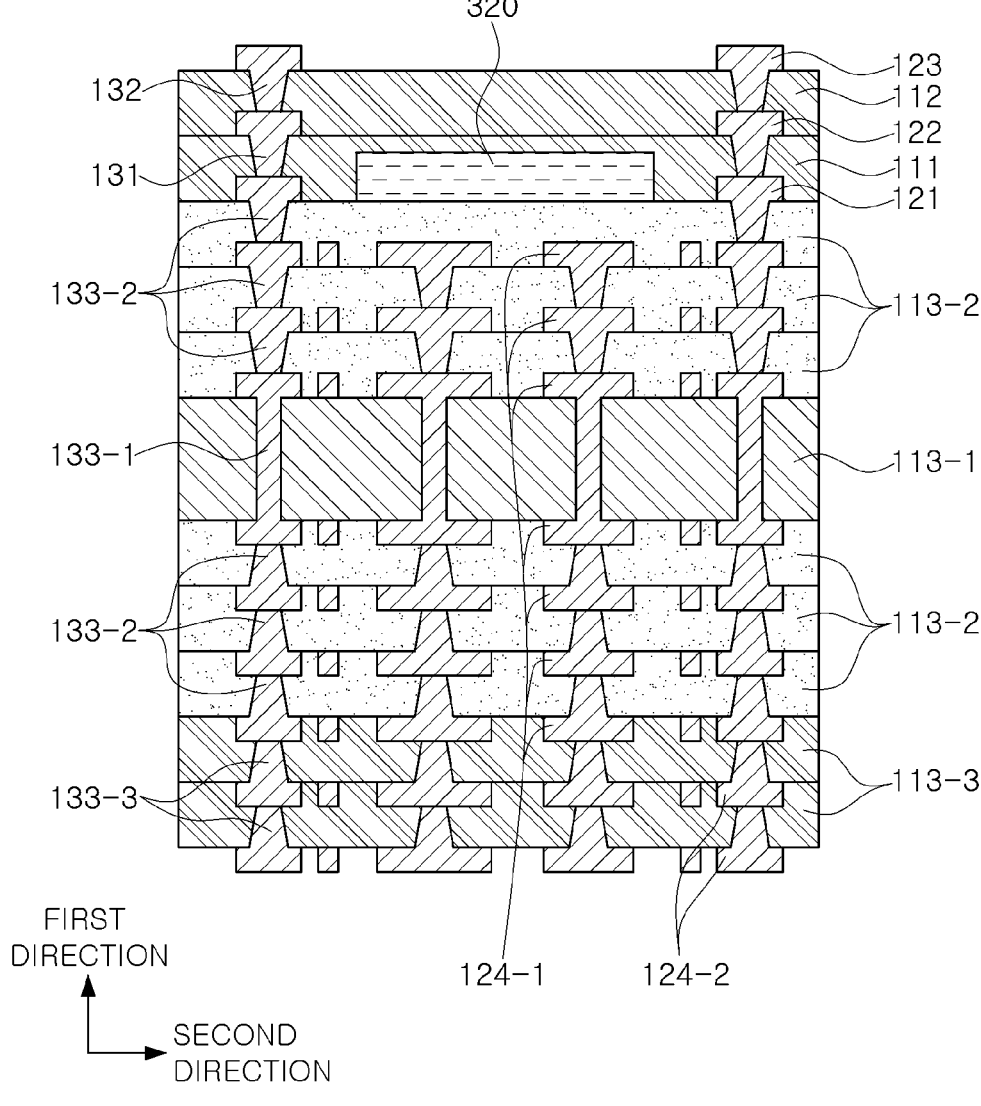

Referring to FIG. 8D, a second insulating layer 112 is formed on the first insulating layer 111 in the build-up process. Additionally, a third wiring layer 123 and a second via layer 132 are formed on the second insulating layer 112. In this case, a build-up insulating layer 113-3, a build-up wiring layer 124-2, and a build-up via layer 133-3 are further formed on an opposite side thereof.

Figure 8E:
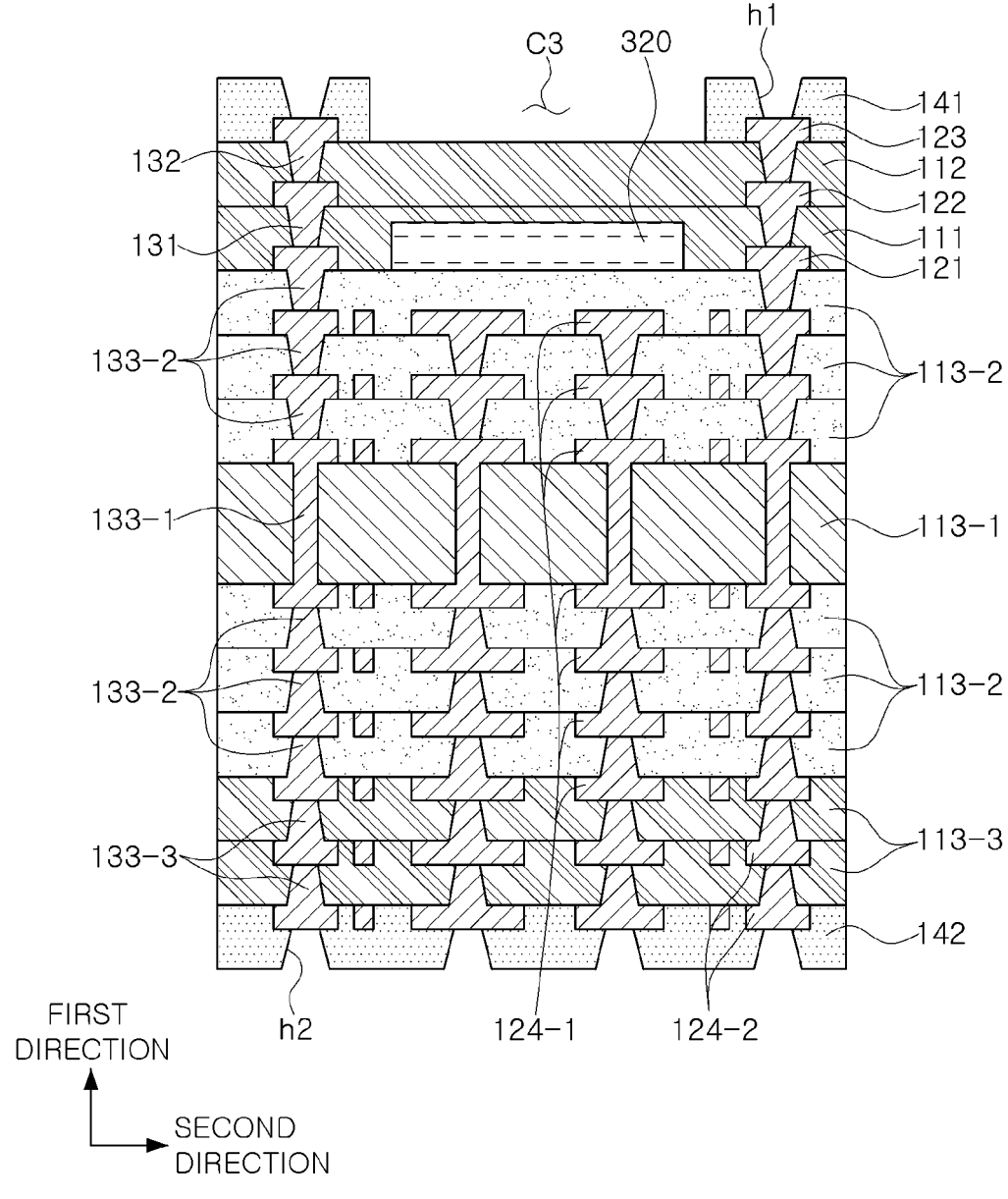

Referring to FIG. 8E, first and second resist layers 141 and 142 are formed on both surfaces of the formed stack. Next, first and second openings h1 and h2 and a third cavity C3 are formed in the first and second resist layers 141 and 142.

Figure 8F:
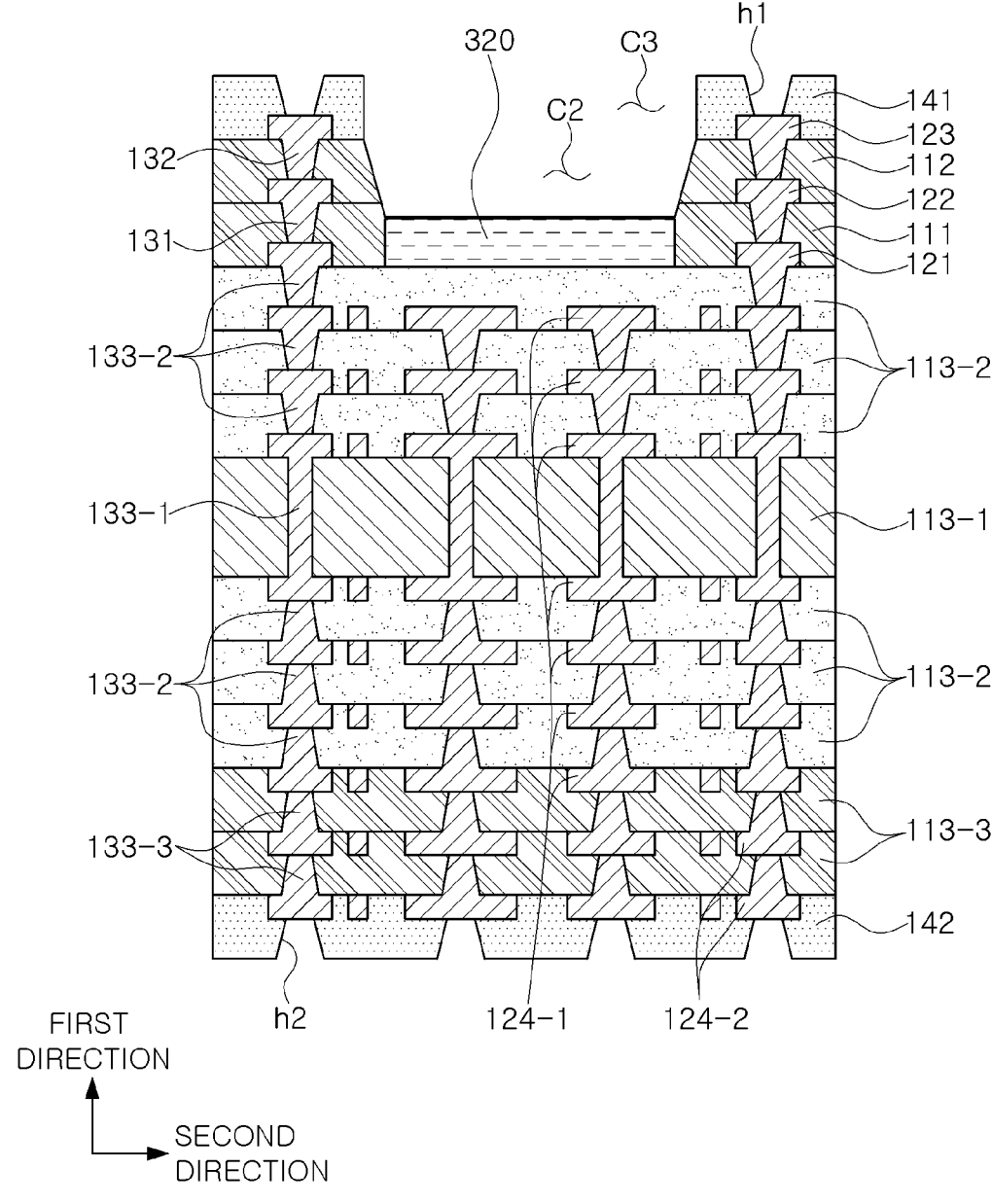

Referring to FIG. 8F, a second cavity C2 is formed in the first and second insulating layers 111 and 112. The second cavity C2 may be formed through laser processing. For example, the second cavity C2 may be formed by processing the second insulating layer 112 exposed from the third cavity C3 with a laser, and a metal block 320 buried in the first insulating layer 111 may be exposed.

Figure 8G:
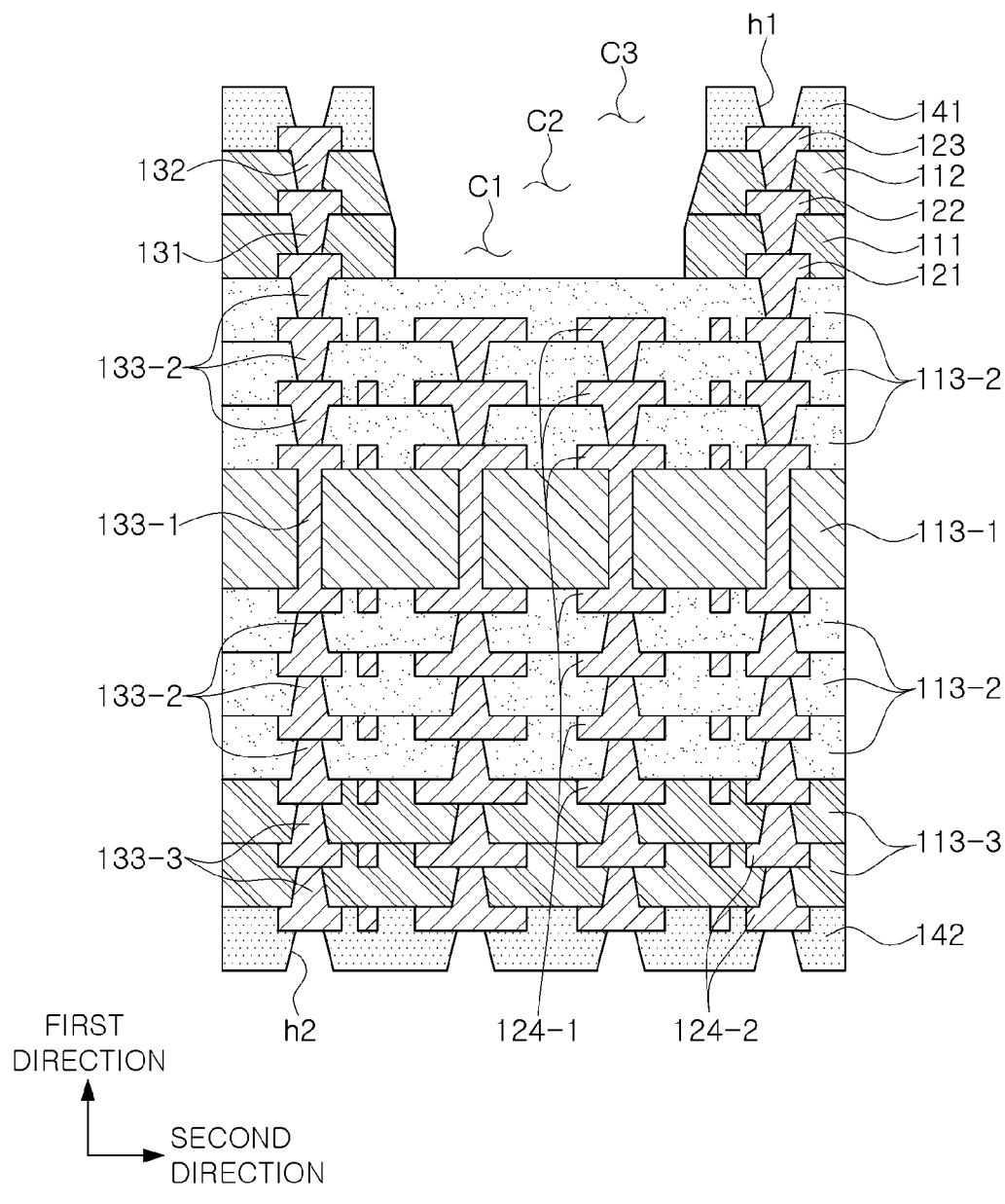

Referring to FIG. 8G, a first cavity C1 is formed in the first insulating layer 111. The first cavity C1 may be formed by removing the metal block 320 by etching. Through a series of processes, the printed circuit board 100C according to another example embodiment described above may be manufactured.

Figure 8H:
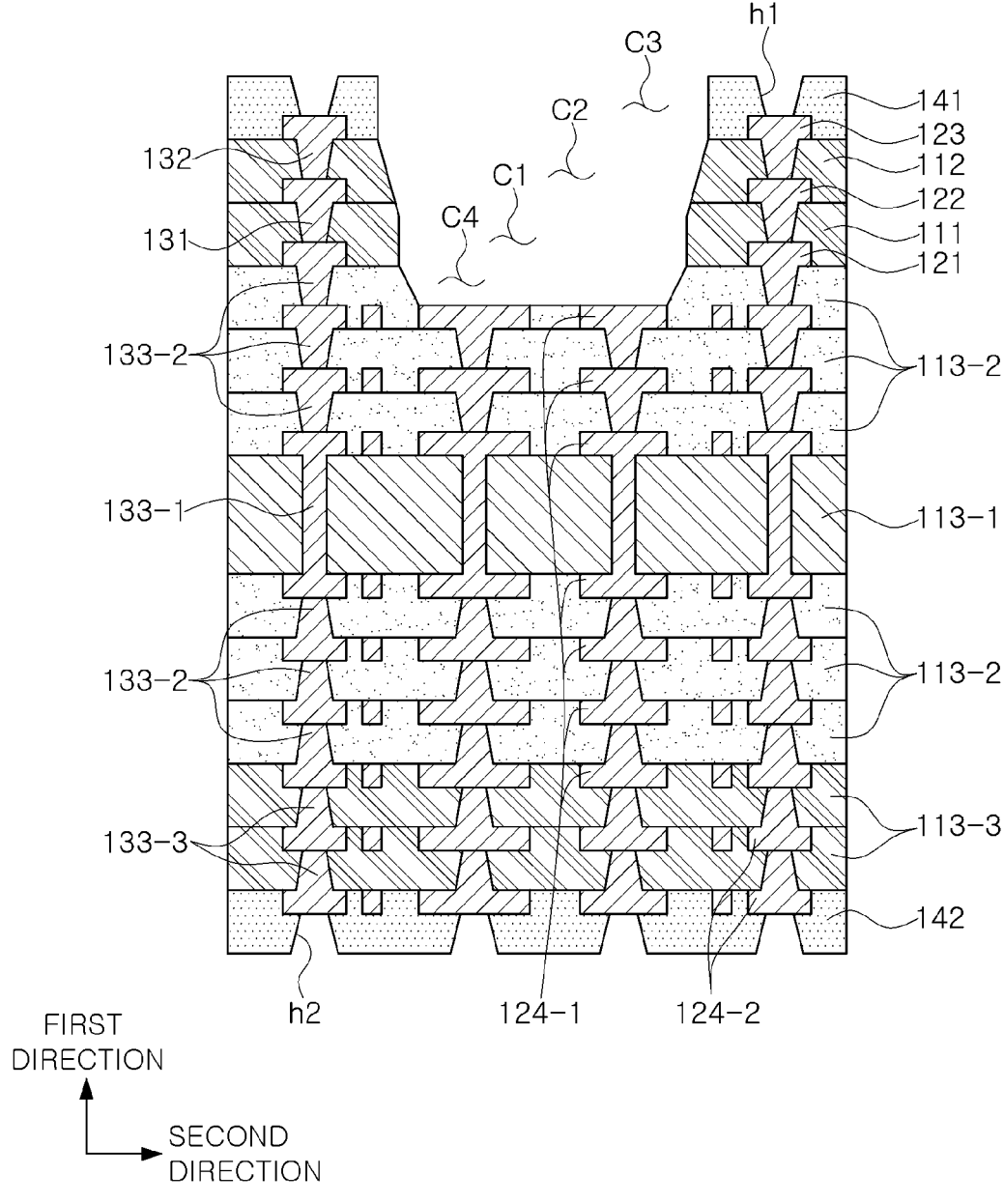

Referring to FIG. 8H, a fourth cavity C4 is formed in at least one build-up insulating layer 113-2 among the plurality of build-up insulating layers 113-1, 113-2 and 113-3. The fourth cavity C4 may be formed by processing, with a laser, a build-up insulating layer 113-2 disposed on an outermost side based on the first direction, for example, an uppermost side, exposed from the first to third cavities C1, C2 and C3, among the plurality of build-up insulating layers 113-1, 113-2 and 113-3. The fourth cavity C4 may expose an outermost side disposed after the first wiring layer 121 based on the first direction, for example, a portion of an uppermost build-up wiring layer 124-1, among the plurality of build-up wiring layers 121, 124-1 and 124-2. Through a series of processes, a printed circuit board 100D according to the above-described modified example embodiment may be manufactured.

Other contents are substantially the same as those described in the printed circuit board 100A according to the above-described example and the printed circuit board 100B according to a modified example embodiment thereof, and the printed circuit board 100C according to another example embodiment described above and the printed circuit board 100D according to a modified example embodiment thereof, and thus, redundant descriptions thereof will be omitted.

Figure 9:
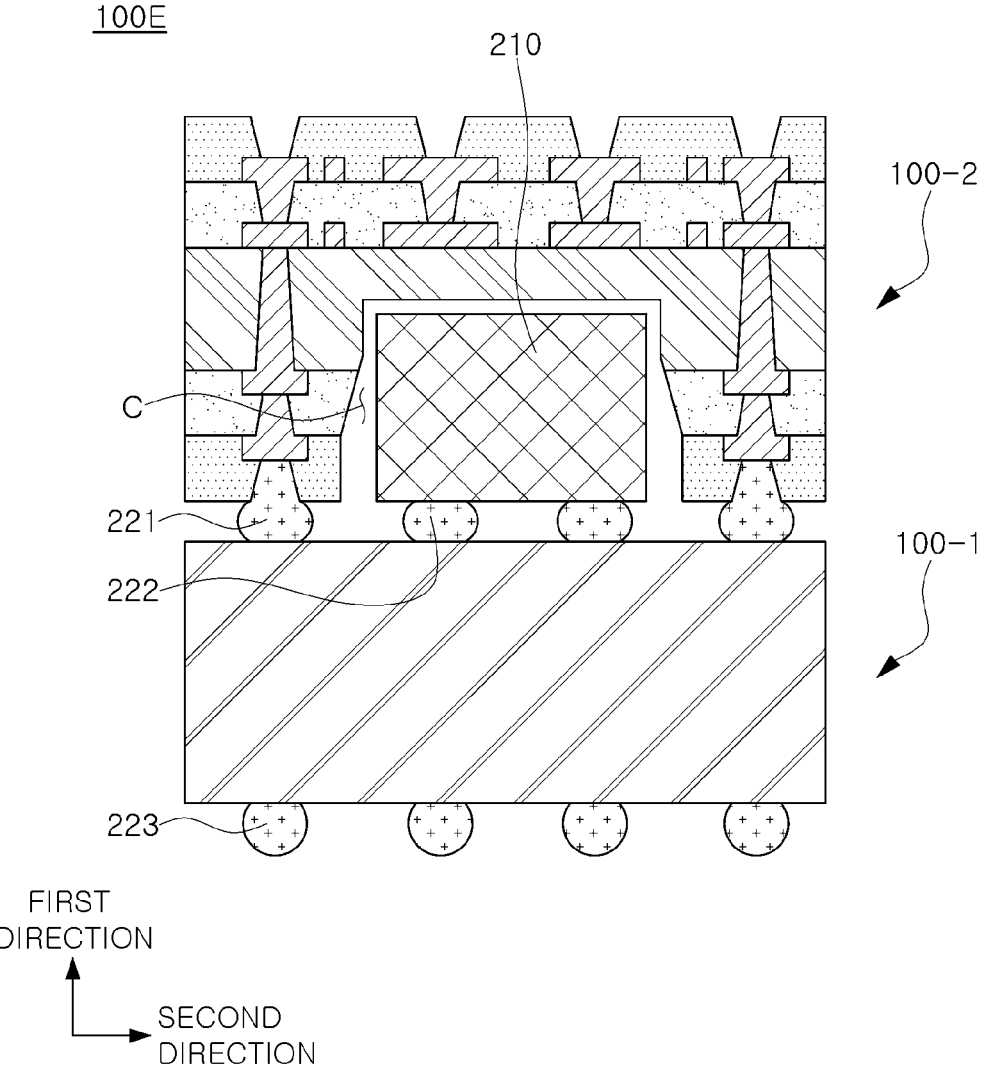
FIGS. 9 to 11 are cross-sectional views schematically illustrating other examples of a printed circuit board.
Figure 10:
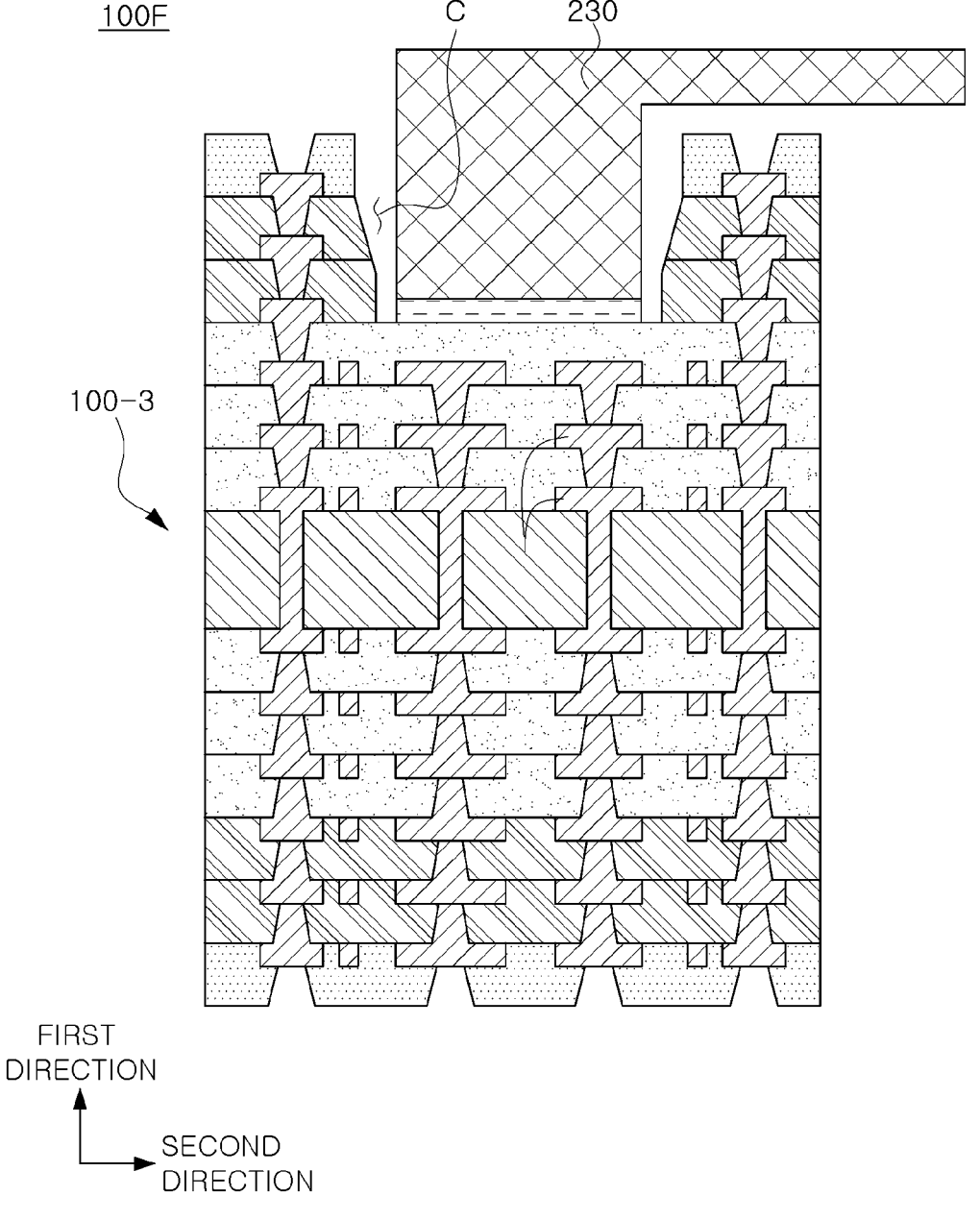
Figure 11:
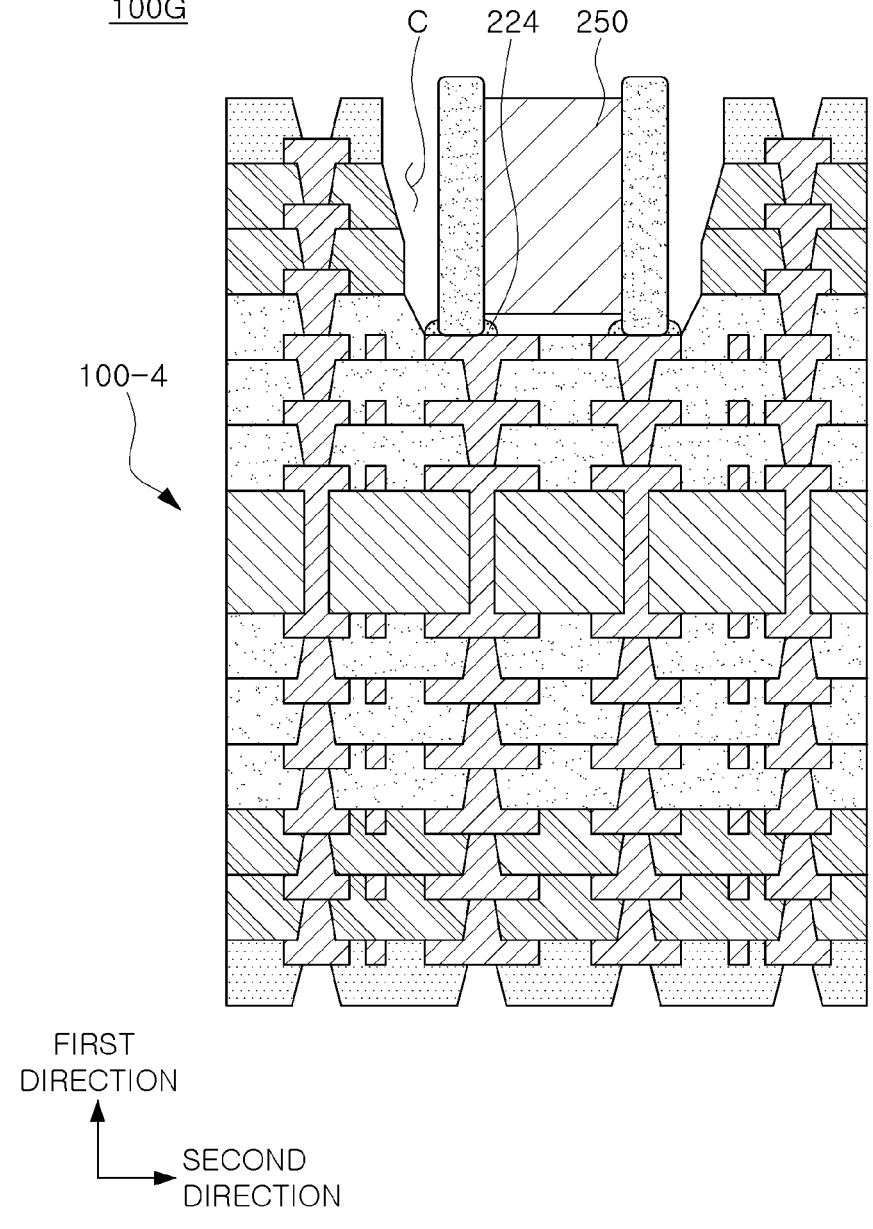

FIGS. 9 to 11 are cross-sectional views schematically illustrating other examples of a printed circuit board.

Referring to FIG. 9, a printed circuit board 100E according to another example embodiment may have a package-on-package structure on which electronic components 210 are mounted. For example, a second package substrate 100-2 may be disposed on a first package substrate 100-1 based on the first direction, electronic components 210 may be disposed between the first and second package substrates 100-1 and 100-2, the first and second package substrates 100-1 and 100-2 may be connected through a first electrical connection metal 221, the electronic component 210 may be mounted on the first package substrate 100-1 through a second electrical connection metal 222, at least a portion of the electronic component 210 may be disposed in a cavity C of the second package substrate 100-2, and a third electrical connection metal 223 may be attached to a lower side of the first package substrate 100-1. The first package substrate 100-1 may be a core-type or coreless-type multilayer printed circuit board. The second package substrate 100-2 may be a printed circuit board 100A according to the example described above, but may have fewer numbers of layers of the build-up insulating layer 113, the build-up wiring layers 121 and 124, and the build-up via layer 133. If necessary, the above-described printed circuit boards 100B, 100C and 100D may be appropriately modified and applied to the second package substrate 100-2. The electronic component 210 may be an active component and/or a passive component, and may include, preferably, a semiconductor chip, but the present disclosure is not limited thereto. The first to third electrical connection metals 221, 222 and 223 may be solder balls or the like. In this manner, the printed circuit board 100E according to another example embodiment may reduce an overall thickness of a module by mounting electronic components through cavity processing of the above-described structure.

Referring to FIG. 10, a printed circuit board 100F according to another example embodiment may have a structure in which a mechanical portion is disposed in a cavity of a package substrate. For example, a mechanical portion 230 such as an optical cable may be disposed in a cavity C of a third package substrate 100-3. The third package substrate 100-3 may be a printed circuit board 100C according to another example embodiment described above. If necessary, the above-described printed circuit boards 100A, 100B and 100D may be appropriately modified and applied to the third package substrate 100-3. In this manner, the printed circuit board 100F according to another example embodiment may provide a cavity having a deep depth required to match heights of the chip and the mechanical portion in a case of placing the mechanical portion such as an optical cable in the package substrate.

Referring to FIG. 11, a printed circuit board 100G according to another example embodiment may have a structure in which thick components are disposed in a cavity of a package substrate. For example, a fourth package substrate 100-4 may be disposed through a fourth electrical connection metal 224 in which a thick component 250, such as a power inductor, and the like, includes a solder in the cavity C. The fourth package substrate 100-4 may be a printed circuit board 100D according to the above-described modified example embodiment. If necessary, the above-described printed circuit boards 100A, 100B and 100C may be appropriately modified and applied to the fourth package substrate 100-4. In this manner, the printed circuit board 100G according to another example embodiment may provide a cavity having a deep depth required to place thick components such as a power inductor on a package substrate.

Other contents are substantially the same as those described in the printed circuit board 100A according to the above-described example embodiment and the printed circuit board 100B according to a modified example embodiment thereof, and the printed circuit board 100C according to another example embodiment described above and the printed circuit according to a modified example embodiment thereof, and thus, redundant descriptions thereof will be omitted.

In the present disclosure, slopes of the wall surfaces may be compared by measuring angles of wall surfaces measured inside each cavity based on a second direction, perpendicular to the first direction.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a thickness, a width, a length, a depth, and the like may be measured with a scanning microscope or an optical microscope based on a cross-section in which a printed circuit board is polished or cut. The cut cross-section may be a vertical cross-section or a horizontal cross-section, and each numerical value thereof may be measured based on a required cut cross-section. When the numerical value is not constant, the numerical value may be determined as an average value of values measured at any five points. A width of an upper end and/or a lower end of a via or a cavity may be measured on a cross-section obtained by cutting a central axis of a via or a cavity in a thickness direction of a substrate. A depth of the via or the cavity may be measured as a distance from an upper end to a lower end of each object on a cross-section obtained by cutting a central axis of each object in the thickness direction of the substrate.

In the present disclosure, a lower side, a lower portion, and a lower surface are used to refer to a downward direction with respect to a cross-section of a drawing, and an upper side, an upper portion, and an upper surface are used to refer to an opposite direction thereof. Furthermore, a side portion, a side surface, and the like, are used to denote directions, perpendicular to upper and lower surfaces. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

What is claimed is:

1. A printed circuit board, comprising:
a first insulating layer having a first surface and a second surface opposing each other in a first direction;
a first wiring layer disposed at the first surface of the first insulating layer;
a second wiring layer disposed at the second surface of the first insulating layer;
a second insulating layer having a third surface and a fourth surface opposing each other in the first direction, and disposed on the first insulating layer so that the third surface is connected to the second surface;
a third wiring layer disposed at the fourth surface of the second insulating layer;
a first cavity penetrating through at least a portion of the first insulating layer from the first surface in the first direction; and
a second cavity penetrating through at least a portion of the second insulating layer in the first direction and connected to the first cavity,
wherein at an interface where the first insulating layer and the second insulating layer are in contact with each other, an inclination of a wall surface of the first cavity is different from an inclination of a wall surface of the second cavity, and
based on the first direction, a depth of the first cavity is smaller than a thickness of the first insulating layer and is greater than a thickness of each of the first and second wiring layers.

2. The printed circuit board according to claim 1, wherein the inclination of the wall surface of the second cavity is larger than the inclination of the wall surface of the first cavity, with respect to the first direction.

3. The printed circuit board according to claim 2, wherein the first cavity has a substantially vertical wall surface, and the second cavity has a tapered wall surface on which a width of a side connected to the first cavity on a cross-section is narrower than a width of an opposite side thereof.

4. The printed circuit board according to claim 1, further comprising:
a resist layer having a fifth surface and a sixth surface opposing each other in the first direction, disposed on the second insulating layer so that the fifth surface is connected to the fourth surface, and having an opening exposing at least a portion of the third wiring layer; and
a third cavity penetrating through at least a portion of the resist layer in the first direction and connected to the second cavity.

5. The printed circuit board according to claim 4, wherein the inclination of the wall surface of the second cavity and an inclination of a wall surface of the third cavity are different, with respect to the first direction.

6. The printed circuit board according to claim 1, further comprising:
a first via layer penetrating through the first insulating layer in the first direction and connecting at least a portion of each of the first and second wiring layers to each other;
a second via layer penetrating through the second insulating layer in the first direction and connecting at least a portion of each of the second and third wiring layers to each other;
a plurality of build-up insulating layers disposed at the first surface of the first insulating layer;
a plurality of build-up wiring layers respectively disposed on or in the plurality of build-up insulating layers in the first direction and including the first wiring layer; and
a plurality of build-up via layers respectively penetrating through at least one of the plurality of build-up insulating layers in the first direction.

7. The printed circuit board according to claim 6, wherein the first cavity penetrates through a portion of the first insulating layer from the second surface in the first direction.

8. The printed circuit board according to claim 7, further comprising:
a fourth cavity penetrating through another portion of the first insulating layer from the first cavity in the first direction and connected to the first cavity,
wherein the fourth cavity exposes at least a portion of at least one of the plurality of build-up wiring layers, and
an inclination of a wall surface of the fourth cavity is larger than the inclination of the wall surface of the first cavity, with respect to the first direction.

9. The printed circuit board according to claim 8, wherein the first cavity has a substantially vertical wall surface, and the fourth cavity has a tapered wall surface on which a width of a side connected to the first cavity on a cross-section is greater than a width of an opposite side thereof.

10. The printed circuit board according to claim 6, wherein the first cavity penetrates through a portion of the first insulating layer from the first surface in the first direction, and

the second cavity further penetrates through another portion of the first insulating layer from the second surface to the first cavity in the first direction.

11. The printed circuit board according to claim 10, further comprising:

a fourth cavity penetrating through at least a portion of at least one of the plurality of build-up insulating layers in the first direction and connected to the first cavity, wherein the fourth cavity exposes at least a portion of at least one of the plurality of build-up wiring layers.

12. The printed circuit board according to claim 11, wherein an inclination of a wall surface of the fourth cavity is larger than the inclination of the wall surface of the first cavity, with respect to the first direction.

13. The printed circuit board according to claim 12, wherein the first cavity has a substantially vertical wall surface, and the fourth cavity has a tapered wall surface on which a width of a side connected to the first cavity on a cross-section is greater than a width of an opposite side thereof.

14. The printed circuit board according to claim 1, wherein a bottom of the first cavity is a portion of the first insulating layer.

15. A printed circuit board, comprising:

a first insulating layer having a first cavity;

a first wiring layer disposed on an upper surface of the first insulating layer and protruding from the upper surface of the first insulating layer;

a second wiring layer disposed on a lower upper surface of the first insulating layer opposing the upper surface, the second wiring layer protruding from the lower surface of the first insulating layer;

a second insulating layer disposed on a lower surface of the first insulating layer, and having a second cavity connected to the first cavity; and a third wiring layer disposed on a lower surface of the second insulating layer, wherein the first cavity is disposed on a level between the first and second wiring layers, and the second wiring layer is embedded in the second insulating layer.

16. The printed circuit board according to claim 15, wherein no wiring layer is disposed between the first and second wiring layers.

17. The printed circuit board according to claim 15, further comprising:

a resist layer disposed on a lower surface of the second insulating layer, covering at least a portion of the third wiring layer, having an opening exposing at least another portion of the third wiring layer, and having a third cavity connected to the second cavity.

18. The printed circuit board according to claim 17, wherein the first insulating layer further includes a fourth cavity connected to the first cavity, the fourth cavity is disposed on a level between the first and second wiring layers, and the fourth cavity exposes at least a portion of the first wiring layer.

19. The printed circuit board according to claim 18, wherein on a cross-section, an average width of the first cavity is greater than an average width of the fourth cavity, an average width of the second cavity is greater than an average width of the first cavity, and an average width of the third cavity is greater than an average width of the second cavity.

20. The printed circuit board according to claim 15, wherein a bottom of the first cavity is a portion of the first insulating layer.

* * * * *